United States Patent [19]
Iwata

[11] Patent Number: 5,852,566
[45] Date of Patent: Dec. 22, 1998

[54] APPARATUS FOR REDUCING QUANTIZATION DISTORTION

[75] Inventor: Toshio Iwata, Sagamihara, Japan

[73] Assignee: Kabushiki Kaisha Kenwood, Tokyo, Japan

[21] Appl. No.: 712,557

[22] Filed: Sep. 13, 1996

[30] Foreign Application Priority Data

Sep. 29, 1995 [JP] Japan .................................. 7-276698

[51] Int. Cl.⁶ .............................. G06F 17/10; G06F 7/38; G06F 17/15
[52] U.S. Cl. .................................. 364/724.1; 364/724.01; 364/724.03; 364/724.13; 364/728.01; 364/728.03
[58] Field of Search ........................ 364/724.01, 724.03, 364/724.13, 728.01, 728.03

[56] References Cited

U.S. PATENT DOCUMENTS

| | | | |
|---|---|---|---|
| 5,457,457 | 10/1995 | Hayashi | 341/144 |
| 5,629,883 | 5/1997 | Iwata | 364/728.07 |

FOREIGN PATENT DOCUMENTS 6-244678 of 1994 Japan .
6-303101 of 1994 Japan .
7-15280 of 1995 Japan .
2 130 829 6/1984 United Kingdom .

*Primary Examiner*—Reba I. Elmore
*Assistant Examiner*—Carolyn T. Baumgardner
*Attorney, Agent, or Firm*—Sixbey, Friedman, Leedom & Ferguson, P.C.; Gerald J. Ferguson, Jr.

[57] ABSTRACT

An apparatus for fully reducing quantization distortion of a digital signal, which includes at least one digital low-pass filter, a counter, a selector and a corrector. Each of the digital low-pass filter(s) operates to pick up predetermined low frequency components from an input digital signal while expanding downward its bit length so as to obtain an output digital signal having the expanded bit length. The counter counts the number of consecutive samples having a same quantized level before and after each sample point of the input digital signal. And, in accordance with the count value of this counter, the selector selects and outputs either the input digital signal whose bit length was expanded downward or a digital signal passed through any one of the digital low-pass filters. Further, the corrector operates to make a discontinuous point (contained in the output of the selector) continuous. Thus, the apparatus allows its output signal to smoothly vary without unnecessarily attenuating the high frequency components.

18 Claims, 23 Drawing Sheets

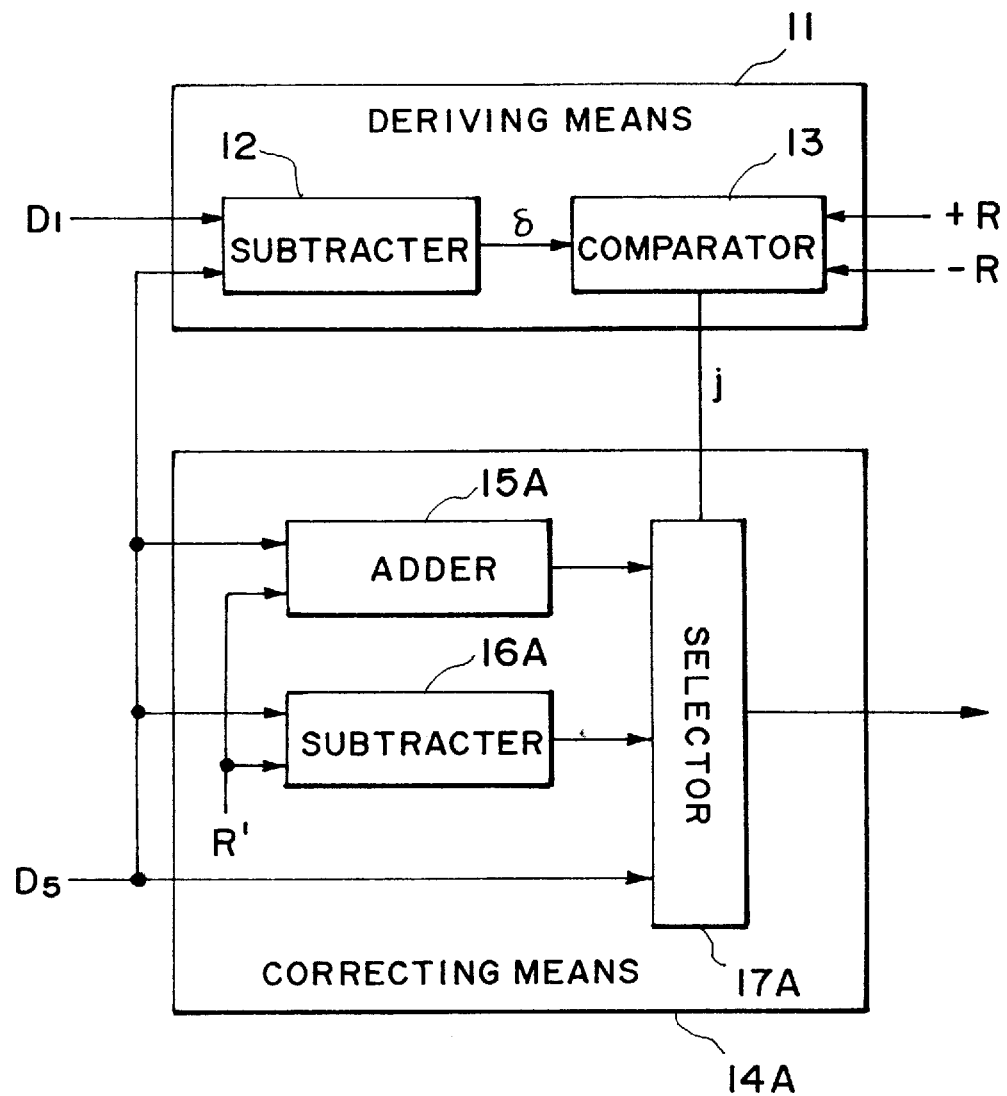
F I G. 15

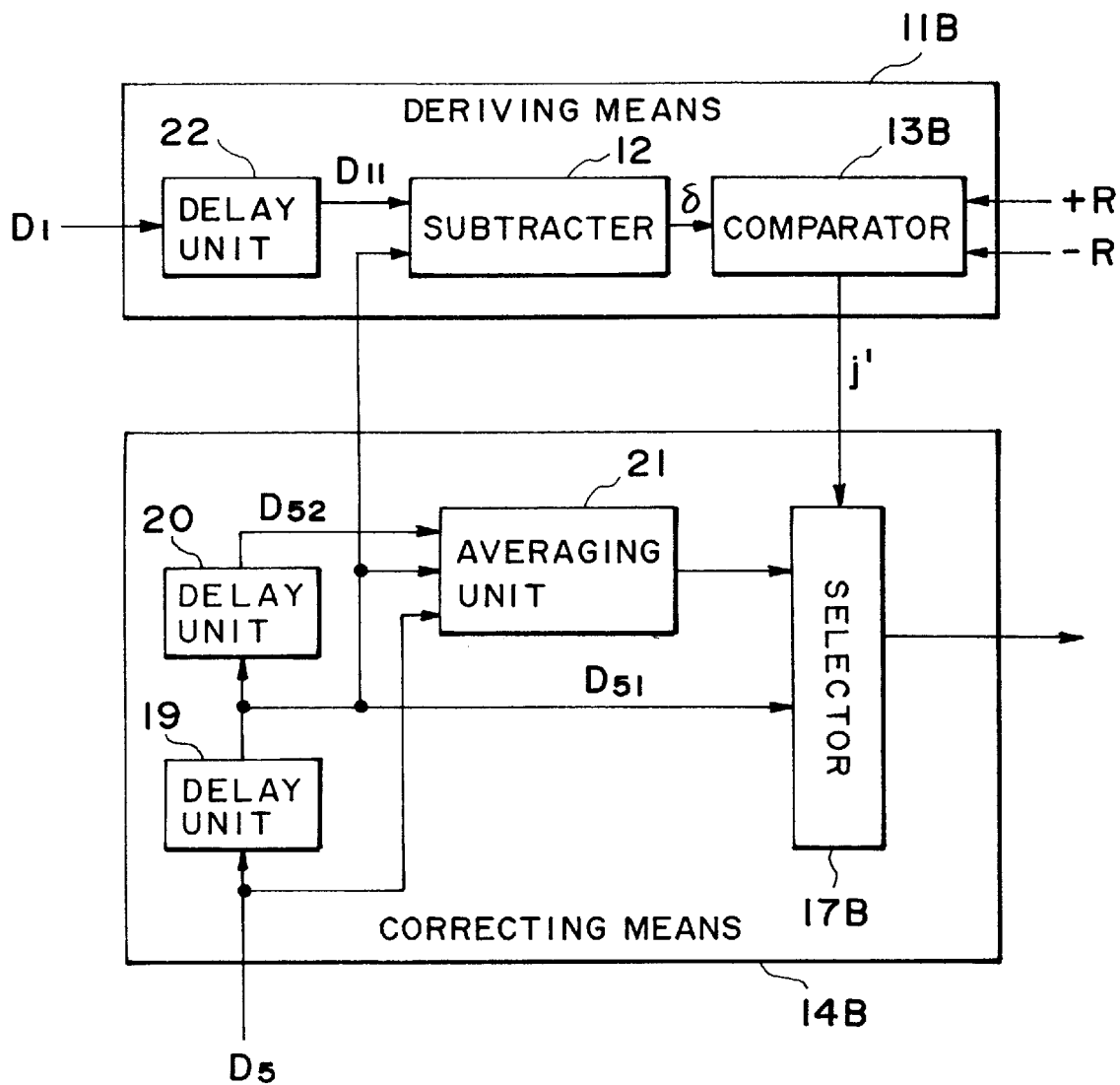
F I G. 16

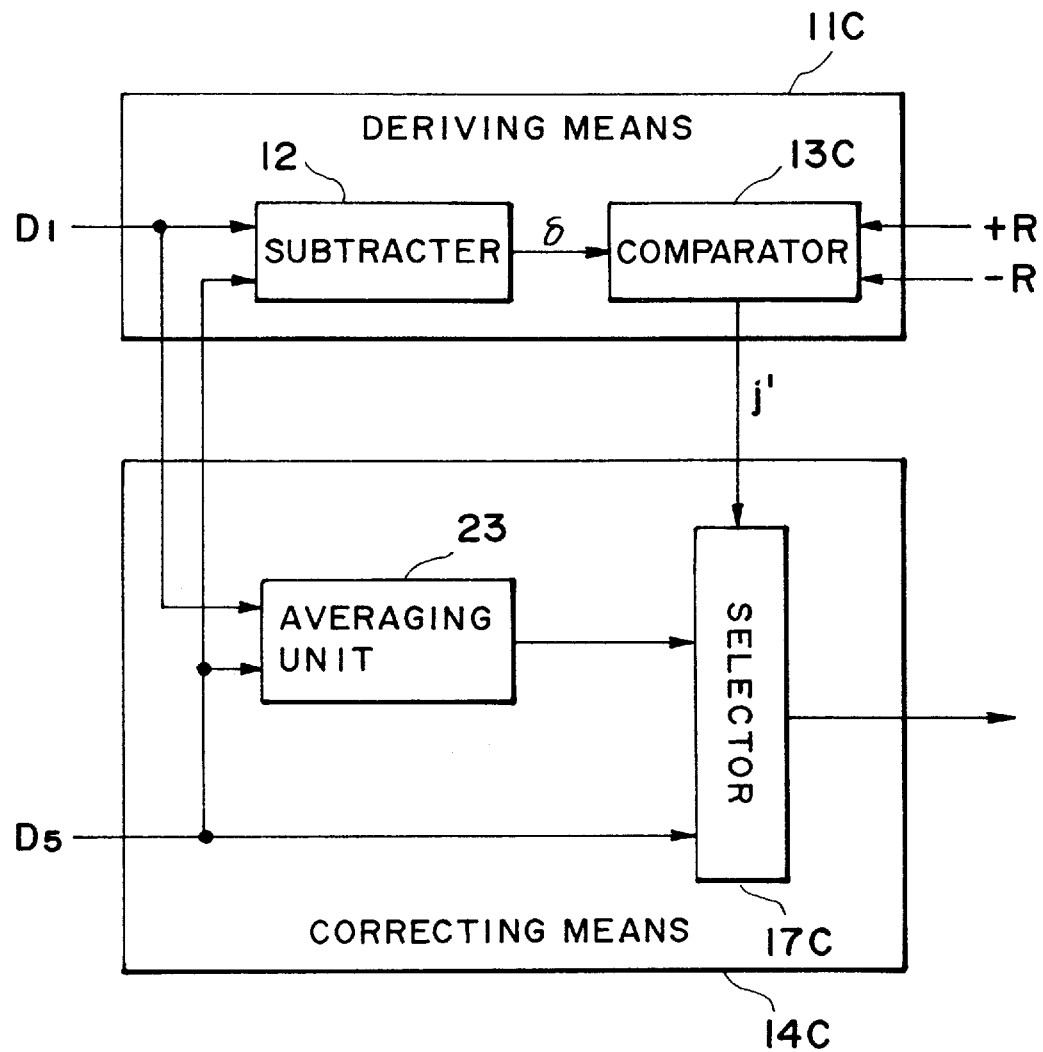
F I G. 17

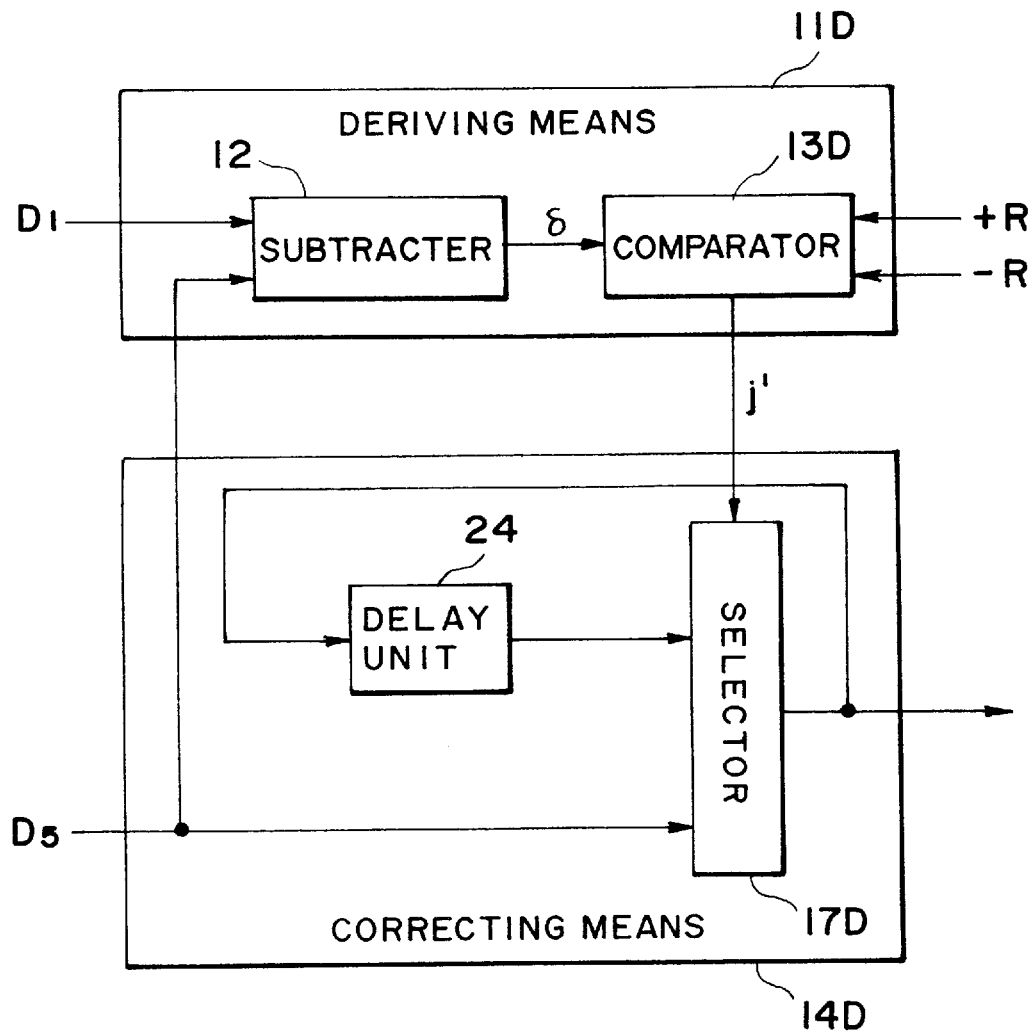
F I G. 18

APPARATUS FOR REDUCING QUANTIZATION DISTORTION

BACKGROUND OF THE INVENTION

1. Field of the Invention

The present invention relates to an apparatus for reducing quantization distortion, and more particularly to a quantization distortion reducing apparatus capable of reducing quantization distortion of an input digital signal.

2. Related Background Art

An analog signal is converted into a digital signal (A/D conversion) and the converted digital signal is reverse-converted into an analog signal (D/A conversion). In this case, the recovered analog signal inevitably contains quantization distortion. This quantization distortion becomes more conspicuous the smaller the dynamic range of the original analog signal.

For example, as shown in FIG. 19, an analog signal X has an attenuating wave of 2 kHz followed by a superposed sine wave of 10 kHz superposed upon the attenuating wave at the trailing portion thereof. This analog signal is sampled by a sampling frequency of 48 kHz to convert it into a digital signal $D_0$ quantized by 16 bits. In this case, as shown in FIG. 20, a period having consecutive points with the same value (in FIG. 20, each digital data of the digital signal $D_0$ is represented by an impulse having an amplitude corresponding to the digital value) appears at the trailing portion of the attenuating wave of 20 kHz.

D/A conversion of a digital signal D is generally equivalent to outputting a rectangular wave having an amplitude proportional to the digital data and a width corresponding to the sampling period, i.e., equivalent to holding the impulse train shown in FIG. 20. An output after D/A conversion is shown in FIG. 21. If the original analog signal is a voice signal, the waveform of the voice signal passed through an analog low-pass filter for folded distortion elimination having a cut-off frequency of 20 kHz, becomes as shown in FIG. 22.

In the front half portion in FIG. 22, the shape of each rectangle is generally smoothed and has relatively small quantization distortion. However, in the back half portion, the waveform is stepwise and quantization distortion is not reduced so much.

As above, during the period having small signal amplitudes (period in which the signal dynamic range is near 1 LSB of the digital data), digital data having the same value becomes consecutive and definite quantization distortion is left even after D/A conversion.

In order to make the back half portion of the signal shown in FIG. 22 have a waveform similar to the original analog signal, the signal may be passed through an analog low-pass filter having a cut-off frequency of not 20 kHz but about 3 kHz. However, in this case, as shown in FIG. 23, the signal of 10 kHz superposed at the trailing portion is attenuated.

SUMMARY OF THE INVENTION

It is an object of the present invention to solve the above conventional problem and provide a quantization distortion reducing apparatus capable of reducing quantization distortion.

According to one aspect of the present invention, there is provided an apparatus for reducing quantization distortion, comprising: a digital filter for picking up the low frequency components of an input digital signal having a frequency of a predetermined cut-off frequency or lower while expanding downward the bit length of the input digital signal; counter means for counting the number of pre- and post-sampling points having the same value at each point of the input digital signal; and selecting means for selecting and outputting, in accordance with the count value of the counting means, the input digital signal whose bit length was expanded downward, for the sections having the count value of a predetermined value or smaller, or a signal passed through the digital filter, for the sections having the count value of a predetermined value or larger.

The digital filter may include a plurality of digital filters each having a different cut-off frequency, and the selecting means selects and outputs the input digital signal whose bit length was expanded downward, for the sections having the count value of a predetermined value or smaller counted by the counting means, or a signal passed through one of the digital filters having a lower cut-off frequency in correspondence with an increase in the count value, for the sections having the count value of a predetermined value or larger.

The apparatus may further comprise deriving means for deriving a discontinuous point contained in the output of the selecting means, and correcting means for making the discontinuous point continues.

The deriving means may derive as the discontinuous point a point having a difference of a predetermined value or larger between the value of the output of the selecting means at each point and the value of the input digital signal at the corresponding point.

The deriving means may derive as the discontinuous point a point having a difference of a predetermined value or larger between the value of the output of the selecting means at each point and the value of the input digital signal at the corresponding point, and lo discriminate between the positive and negative difference values; and the correcting means may replace the discontinuous point in the output of the selecting means derived by the deriving means by a value obtained through addition or substraction of a value preset in accordance with the positive or negative difference, to or from the input digital signal, for smoothing the output signal.

The deriving means may derive as the discontinuous point a point having a difference of a predetermined value or larger between the value of the output of the selecting means at each point and the value of the input digital signal at the corresponding point, and discriminate between the positive and negative difference values; and the correcting means may replace the discontinuous point in the output of the selecting means derived by the deriving means by a value obtained through addition or substraction of a value preset in accordance with the positive or negative difference, to or from the value of the discontinuous point, for smoothing the output signal.

The correcting means may replace the discontinuous point in the output of the selecting means derived by the deriving means by an average of the values of a plurality of points near the discontinuous point, for smoothing the output signal.

The correcting means may replace the discontinuous point in the output of the selecting means derived by the deriving means by an average of the value of the discontinuous point and the value of the input digital signal at the corresponding point.

The correcting means may replace the discontinuous point in the output of the selecting means derived by the deriving means by a value at a continuous point immediately before the discontinuous point.

According to the quantization distortion reducing apparatus of the invention, the low frequency components of the input digital signal having a frequency of a predetermined cut-off frequency or lower are picked up by a digital filter while expanding downward the bit length of the input digital signal. The counter means counts the number of pre- and post-sampling points having the same value at each point of the input digital signal. In accordance with the count value of the counting means, the selecting means selects and outputs the input digital signal whose bit length was expanded downward, for the sections having the count value of the predetermined value or smaller, or a signal passed through the digital filter, for the sections having the count value of the predetermined value or larger.

Therefore, for the sections having a predetermined number of consecutive points or more with the same value and having relatively large quantization distortion as compared to the signal amplitude, the input digital signal is replaced by a signal containing the low frequency components of the input digital signal having a frequency of the predetermined cut-off frequency or lower and picked up by the digital filter while expanding downward the bit length of the input digital signal. Therefore, the output signal can be changed to a smooth curve and quantization distortion can be reduced. For the sections not having a predetermined number of consecutive points or more with the same value and having relatively small quantization distortion as compared to the signal amplitude, the input digital signal whose bit length was expanded downward is used at it is. Therefore, the high frequency components are not attenuated unnecessarily.

Further, a plurality of digital filters are provided each filter having a different cut-off frequency. The selecting means selects and outputs the input digital signal whose bit length was expanded downward, for the sections having the count value of a predetermined value or smaller counted by the counting means, or a signal passed through one of the digital filters having a lower cut-off frequency in correspondence with an increase in the count value. Therefore, both large and small quantization distortions as compared to the signal amplitude can be reliably reduced while avoiding an attenuation of the signal components.

Still further, the deriving means derives a discontinuous point contained in the output of the selecting means, and the correcting means makes the discontinuous point continuous. Therefore, it is possible to prevent a new generation of waveform distortion.

Further, the deriving means derives as the discontinuous point a point having a difference of a predetermined value or larger between the value of the output of the selecting means at each point and the value of the input digital signal at the corresponding point. Therefore, a discontinuous point of the output of the selecting means can be easily and correctly judged.

Furthermore, the deriving means derives as the discontinuous point a point having a difference of a predetermined value or larger between the value of the output of the selecting means at each point and the value of the input digital signal at the corresponding point, and discriminates between the positive and negative difference values. The correcting means replaces the discontinuous point in the output of the selecting means derived by the deriving means by a value obtained through addition or substraction of a value preset in accordance with the positive or negative difference, to or from the input digital signal, for smoothing the output signal. Therefore, it becomes possible to reliably avoid a generation of a discontinuous point in the output signal having a predetermined value or larger, by using a simple circuit arrangement.

Still, the deriving means derives as the discontinuous point a point having a difference of a predetermined value or larger between the value of the output of the selecting means at each point and the value of the input digital signal at the corresponding point, and discriminates between the positive and negative difference values. The correcting means replaces the discontinuous point in the output of the selecting means derived by the deriving means by a value obtained through addition or substraction of a value preset in accordance with the positive or negative difference, to or from the value of the discontinuous point, for smoothing the output signal. Therefore, it becomes possible to reliably avoid a generation of a discontinuous point in the output signal having a predetermined value or larger, by using a simple circuit arrangement.

Still, the correcting means replaces the discontinuous point in the output of the selecting means derived by the deriving means by an average of the values of a plurality of points near the discontinuous point, for smoothing the output signal. Therefore, it becomes possible to reliably avoid a generation of a discontinuous point in the output signal, by using a simple circuit arrangement.

Still further, the correcting means replaces the discontinuous point in the output of the selecting means derived the deriving means by an average of the value of the discontinuous point and the value of the input digital signal at the corresponding point. Therefore, it becomes possible to reliably avoid a generation of a discontinuous point in the output signal, by using a simple circuit arrangement.

Still, the correcting means replaces the discontinuous point in the output of the selecting means derived by the deriving mans by a value at a continuous point immediately before the discontinuous point. Therefore, it becomes possible to reliably avoid a generation of a discontinuous point in the output signal, by using a simple circuit arrangement.

BRIEF DESCRIPTION OF THE DRAWINGS

FIG. 15 is a circuit diagram in block form showing modifications of the deriving means and correcting means.

FIG. 16 is a circuit diagram in block form showing other modifications of the deriving means and correcting means.

FIG. 17 is a circuit diagram in block form showing further modifications of the deriving means and correcting means.

FIG. 18 is a circuit diagram in block form showing still further modifications of the deriving means and correcting means.

DETAILED DESCRIPTION OF THE PREFERRED EMBODIMENTS

Figure 1:
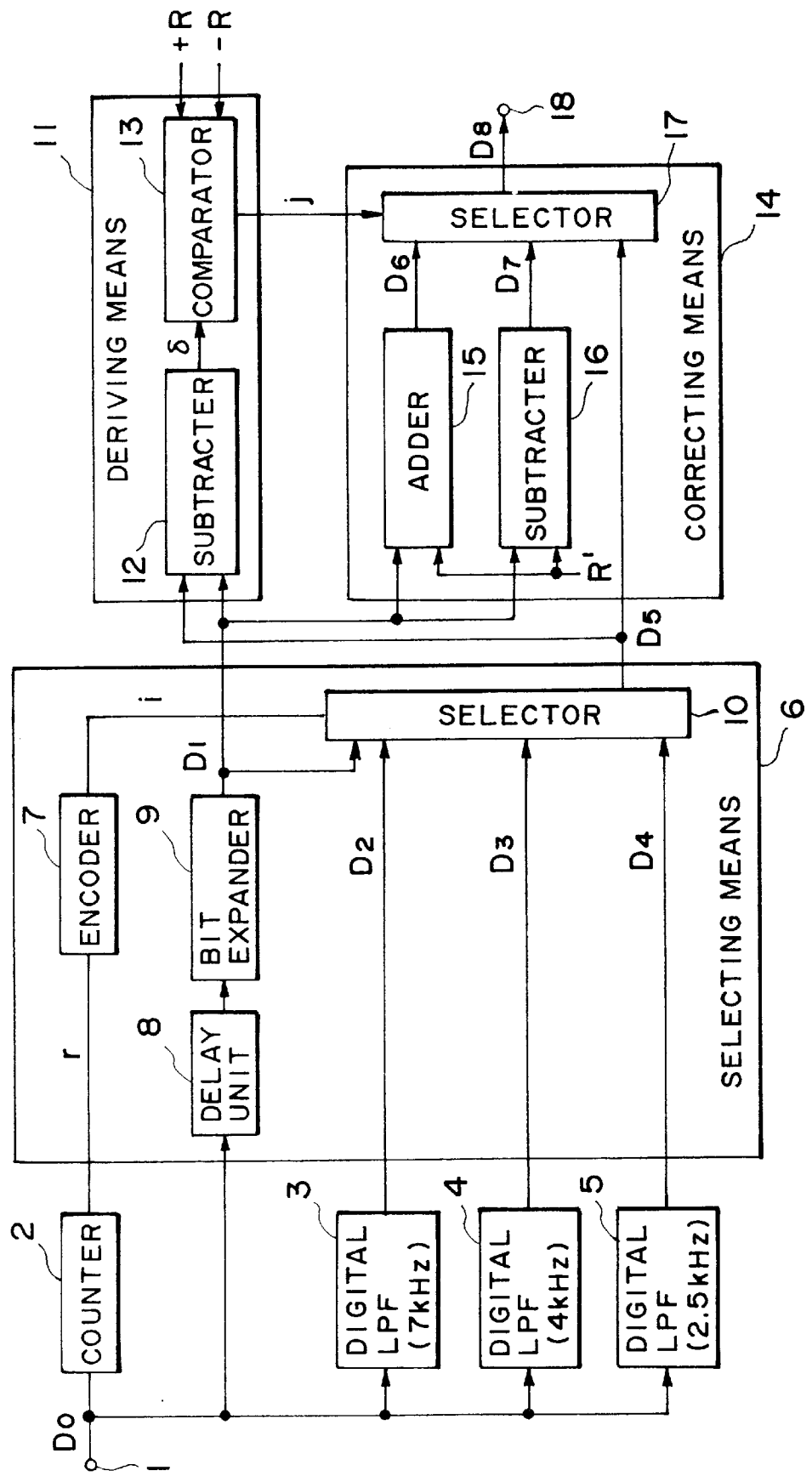
FIG. 1 is a circuit diagram in block form showing a quantization distortion reducing apparatus according to an embodiment of the invention.

FIG. 1 is a circuit diagram in block form showing a quantization distortion reducing apparatus according to an embodiment of the invention.

Reference numeral 1 represents a digital signal input terminal to which input is, for example, a digital signal $D_0$ (e.g., a voice signal having a signal band width of 20 kHz or narrower) having a sampling frequency of 48 kHz and a length of 16 bits. Reference numeral 2 represents a counter for counting the number of consecutive pre- and post-sampling points at each point (exclusive of this point) having the same value of the input digital signal $D_0$ and outputting the count number representative of the degree of quantization distortion. It can be considered that if the count of the consecutive sampling points having the same value is large, the quantization distortion is large in correspondence with the signal amplitude at the sampling point. Reference numerals 3 to 5 represent digital low-pass filters having cut-off frequencies of 7 kHz, 4 kHz, and 2.5 kHz, respectively, and passing the low frequency components of the input digital signal $D_0$ through predetermined internal calculations while expanding downward the input digital signal $D_0$ by 4 bits. Each digital low-pass filter 3 to 5 outputs the calculation result of 20-bit length.

It is assumed that the counter 2 has a Td delay time (in this example, 146 μs which is seven times as long as the sampling period) from when a sampling point of the input digital signal $D_0$ is input and to when the count number at the sampling point is output, and that the group delay time of each digital low-pass filter 3 to 5 is equal to Td.

Reference numeral 6 represents a selecting means which selects and outputs, in accordance with the output of the counter 2, the input digital signal $D_0$ expanded downward by 4 bits, during the period while the count value is a predetermined value or smaller, or an output of one of the digital low-pass filters 3 to 5 having a lower cut-off frequency in correspondence with an increase in the count value, during the period while the count value is a predetermined value or larger.

Of the selecting means, an encoder 7 classifies the count value output from the counter 2 into a plurality of stages. In this example, the count value r is classified into the following four stages, and a signal i representative of the stage is output.

| | |
|---|---|
| r=0 | 1st stage |
| $1 \leq r \leq 2$ | 1st stage |
| $3 \leq r \leq 5$ | 1st stage |
| $6 \leq r$ | 1st stage |

The count value r may be divided into four stages having ranges different from the above.

Reference numeral 8 represents a delay unit for delaying the input digital signal $D_0$ by Td for compensating for the delay time of the counter 2 and digital low-pass filters 3 to 5. Reference numeral 9 represents a bit expander for expanding the delayed input digital signal $D_0$ downward by 4 bits.

Reference numeral 10 represents a selector for selecting and outputting an output $D_1$ of the bit expander 9 when the output i of the encoder 7 is "1", an output $D_2$ of the digital low-pass filter 3 when the output i is "2", an output $D_3$ of the digital low-pass filter 4 when the output i is "3", or an output $D_4$ of the digital low-pass filter 5 when the output i is "4". During the period while the input digital signal $D_0$ has a small relative quantization distortion as compared to the signal amplitude and the count value r is "0", the output $D_1$ of the bit expander 9 is selected so that the output has a waveform similar to the input digital signal $D_0$ and is output without any attenuation. During the period while the input digital signal $D_0$ has a large relative quantization distortion as compared to the signal amplitude and the count value r is not "0", one of the outputs $D_2$ to $D_4$ of the digital low-pass filters 3 to 5 is selected so that the period having the consecutive sampling points with the same value becomes a smooth curve and quantization distortion can be reduced.

One of the outputs $D_2$ to $D_4$ of the digital low-pass filters 3 to 5 is selected which has a lower cut-off frequency in correspondence with an increase of the count value. The reason for this is not to attenuate the signal components while both large and small relative quantization distortions as compared to the signal amplitude are reliably reduced.

Consider the case wherein only the digital low-pass filter 3 having the cut-off frequency of 7 kHz is used, and during the period of r=0, the output $D_1$ is selected and during the period of $1 \leq r$ the output $D_2$ of the digital low-pass filter 3 is selected. In this case, although during the period while the number of consecutive points having the same value is small (small relative quantization distortion as compared to the signal amplitude), the input digital signal $D_0$ can be easily smoothed, during the period while the number of consecutive points having the same value is large (large relative quantization distortion as compared to the signal amplitude), the input digital signal $D_0$ can not be smoothed because the frequency components are shifted to the lower band.

Conversely, consider the case wherein only the digital low-pass filter 5 having the cut-off frequency of 2.5 kHz is used, and during the period of $r \leq 5$, the output $D_1$ is selected and during the period of $6 \leq r$ the output $D_4$ of the digital low-pass filter 5 is selected. In this case, although during the period while the number of consecutive points having the same value is large, the input digital signal $D_0$ can be easily smoothed, the period having consecutive points in the range of $r \leq 5$ can not be smoothed. If $D_1$ is selected during the period of r=0 and $D_4$ of the digital low-pass filter 5 is selected during the period of $1 \leq r$, the period while the number of consecutive points having the same value is relatively small, has the frequency components shifted from the cut-off frequency toward the high frequency so that the input digital signal is attenuated.

The selecting means 6 outputs a digital signal $D_5$ by reducing quantization distortion without attenuating the input digital signal. However, there is a possibility that a discontinuous point may be generated at the switching timing of the selector 10. In the embodiment shown in FIG. 1, this discontinuous point is made continuous at the succeeding stage of the selecting means 6.

Reference numeral 11 represents deriving means for deriving a discontinuous point having a difference larger than a predetermined value between the value of the output $D_5$ of the selecting means at each point and the value of the input digital signal $D_0$ at the corresponding point. The deriving means 11 also discriminates between positive and negative differences. Of the deriving means 11, a subtracter 12 subtracts the output $D_5$ of the selecting means 6 by the bit expanded input digital signal $D_1$, and a comparator 13 compares an output δ of the subtracter 12 with positive and negative reference values +R and −R, and outputs the comparison result j:

$j=1$ for $-R<\delta<+R$ $j=2$ for $+R\leq\delta$ $j=3$ for $\delta\leq-R$ j=2 indicates that a difference between $D_5$ and $D_1$ is positive, and j=3 indicates that the difference is negative. An output of the selecting means 6 at j=2 or j=3 shows a discontinuous point generated by switching of the selector 10.

R is an arbitrary positive value. For example, it is assumed here that R=8 (corresponding to (½) LSB of the input digital signal $D_1$ of 16-bit length).

Reference numeral 14 represents correcting means for making a discontinuous point continuous by replacing the discontinuous point output from the selecting means 6 and derived by the deriving means 11 by a value obtained through addition or substraction of a value preset in accordance with a difference between $D_5$ and $D_1$ to or from the value at the corresponding point of the bit expanded input digital signal $D_1$. Of the correcting means 14, an adder 15 adds R' to the bit expanded input digital signal $D_1$, and a subtracter 16 subtracts R' from the bit expanded input digital signal $D_1$. Reference numeral 17 represents a selector which in accordance with the comparison result by the comparator, selects and outputs the output $D_5$ of the selecting means 6 if j=1, an output $D_6$ of the adder 15 if j=2, or an output $D_7$ of the subtracter 16 if j=3. R' is an arbitrary positive value, and in this example, R=R'.

Of the output of the selecting means 6, the discontinuous point derived by the deriving means 11 is replaced by an output of the adder 15 or subtracter 16. Therefore, the difference from the input digital signal $D_0$ at the discontinuous point is limited to the predetermined value or smaller so that the discontinuous point can be made smooth.

A digital signal $D_8$ output from the correcting means after reduction of quantization distortion is supplied from an output terminal to, for example, a D/A converter (not shown).

Next, the operation of the above embodiment will be described with reference to FIGS. 2 to 14.

Figure 20:
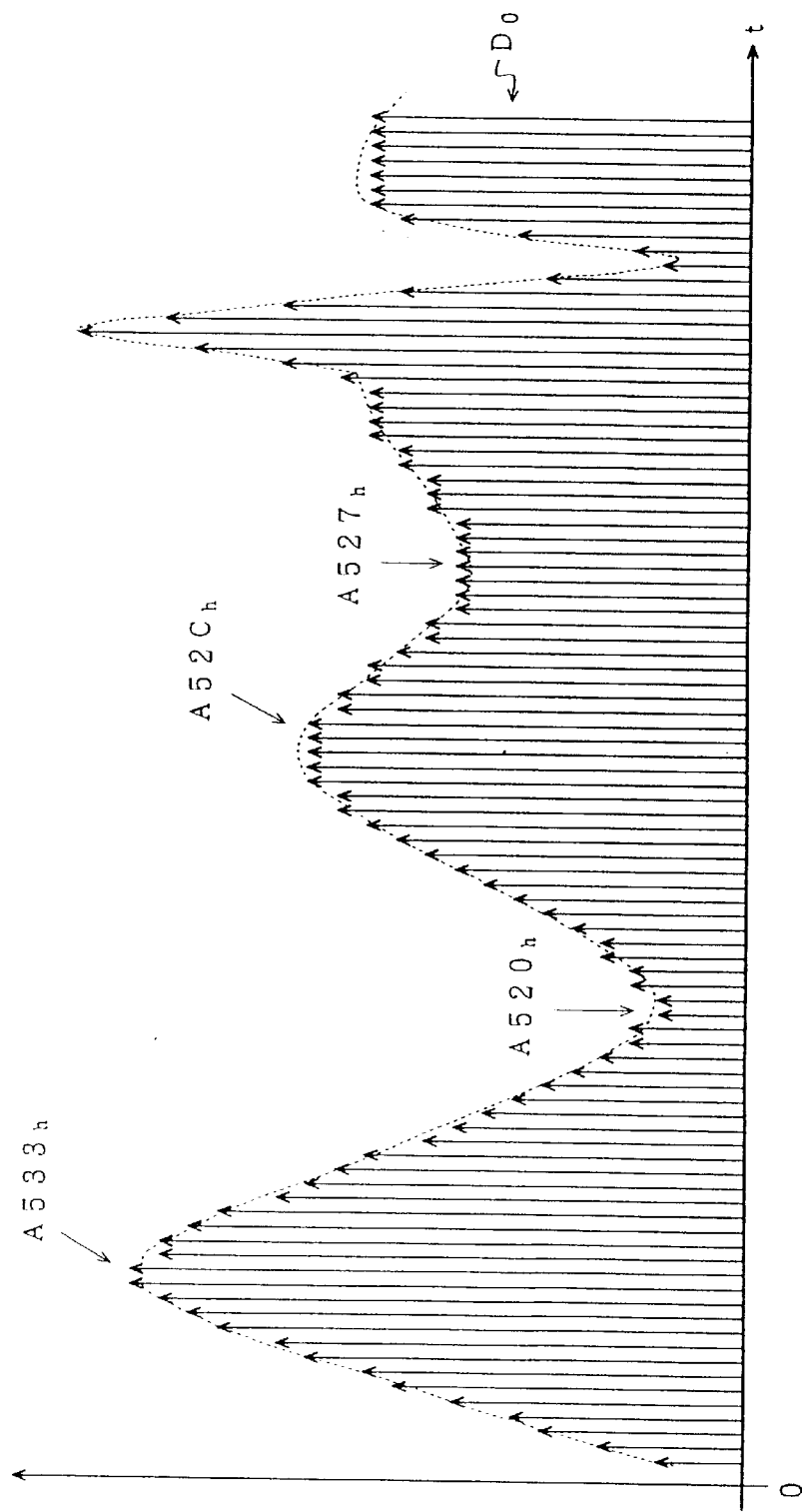
FIG. 20 is a diagram showing a waveform of the analog signal shown in FIG. 19 after A/D conversion.
Figure 21:
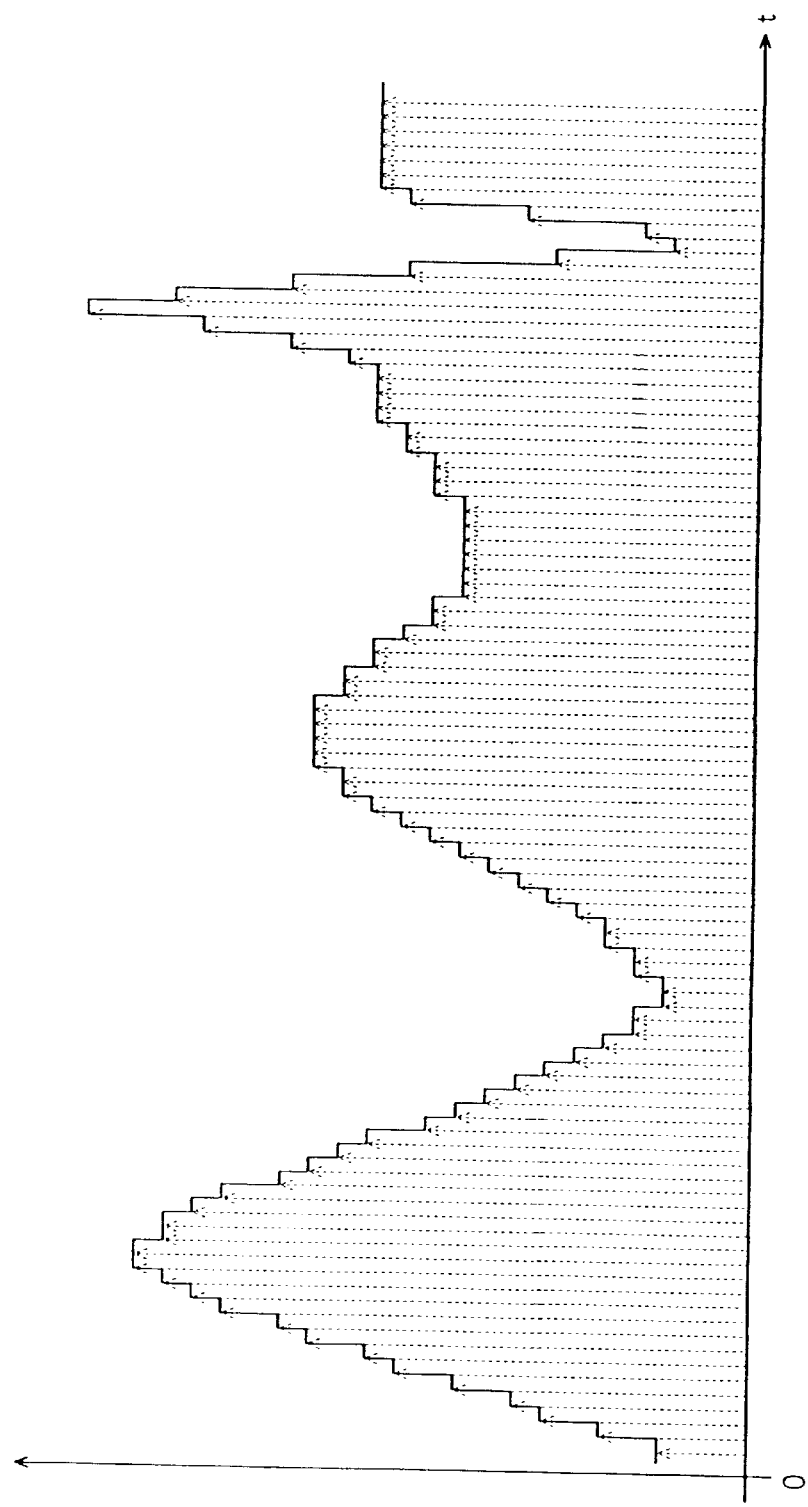
FIG. 21 is a diagram showing a waveform of the digital signal shown in FIG. 20 after D/A conversion.

For the convenience of description, an input to the input terminal is assumed to be an input digital signal $D_0$ shown in FIG. 20 (waveform having an attenuating wave of 2 kHz and one cycle of a sine wave of 10 kHz superposed at the trailing portion of the attenuating wave).

Figure 2:
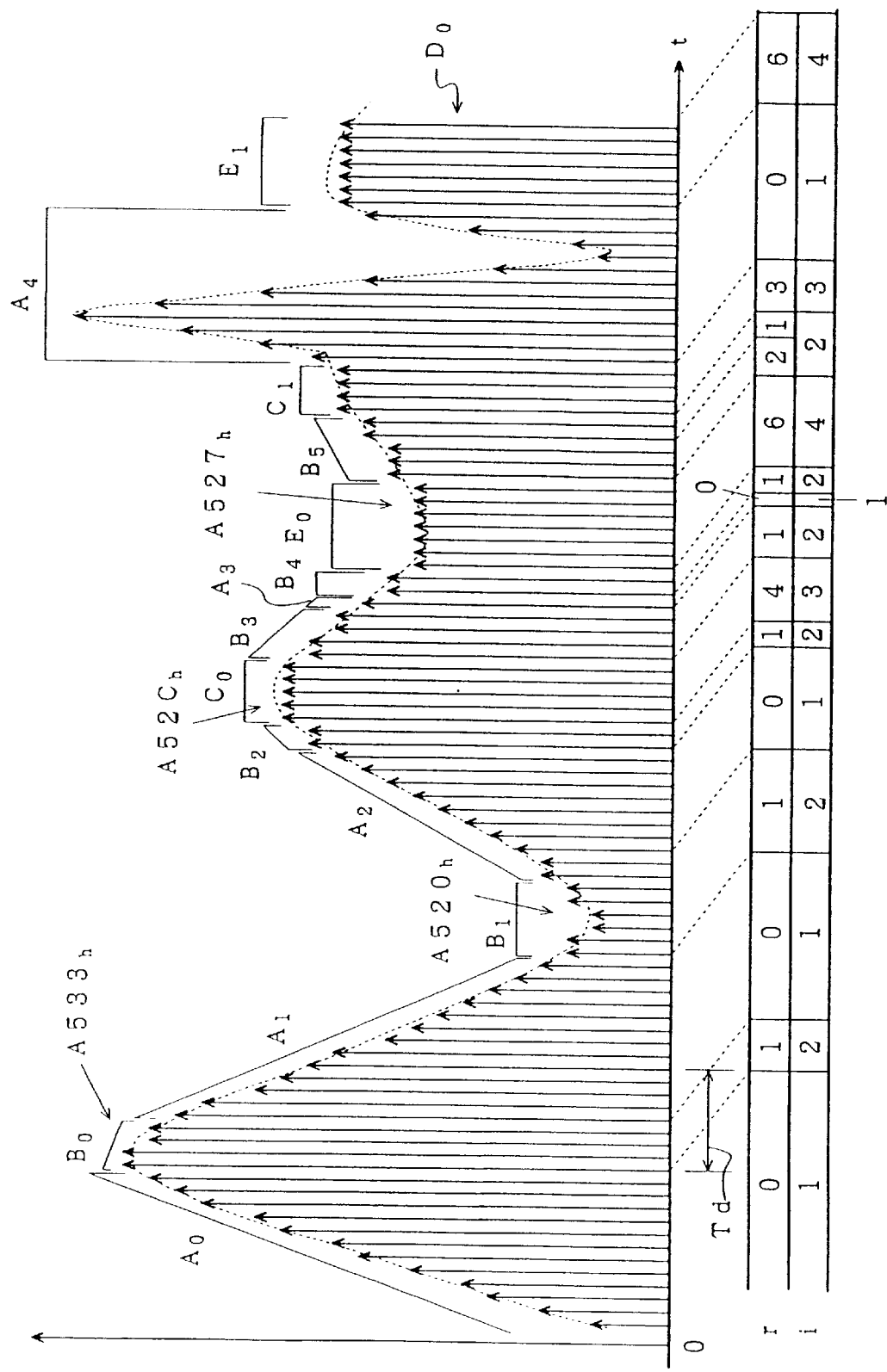
FIG. 2 is a diagram illustrating the operation of a counter and an encoder.
Figure 3:
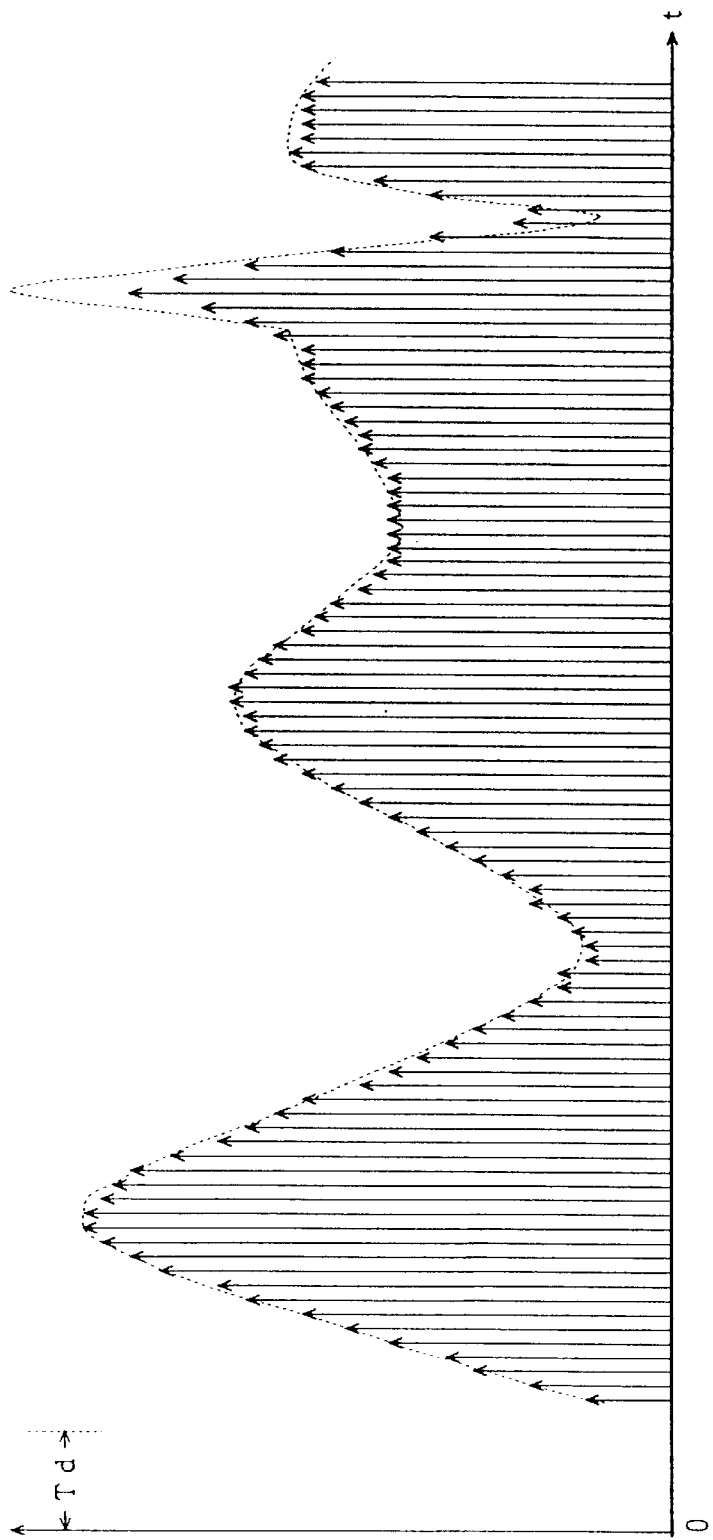
FIG. 3 is a diagram showing an output of a digital low-pass filter having a cut-off frequency of 7 kHz.
Figure 4:
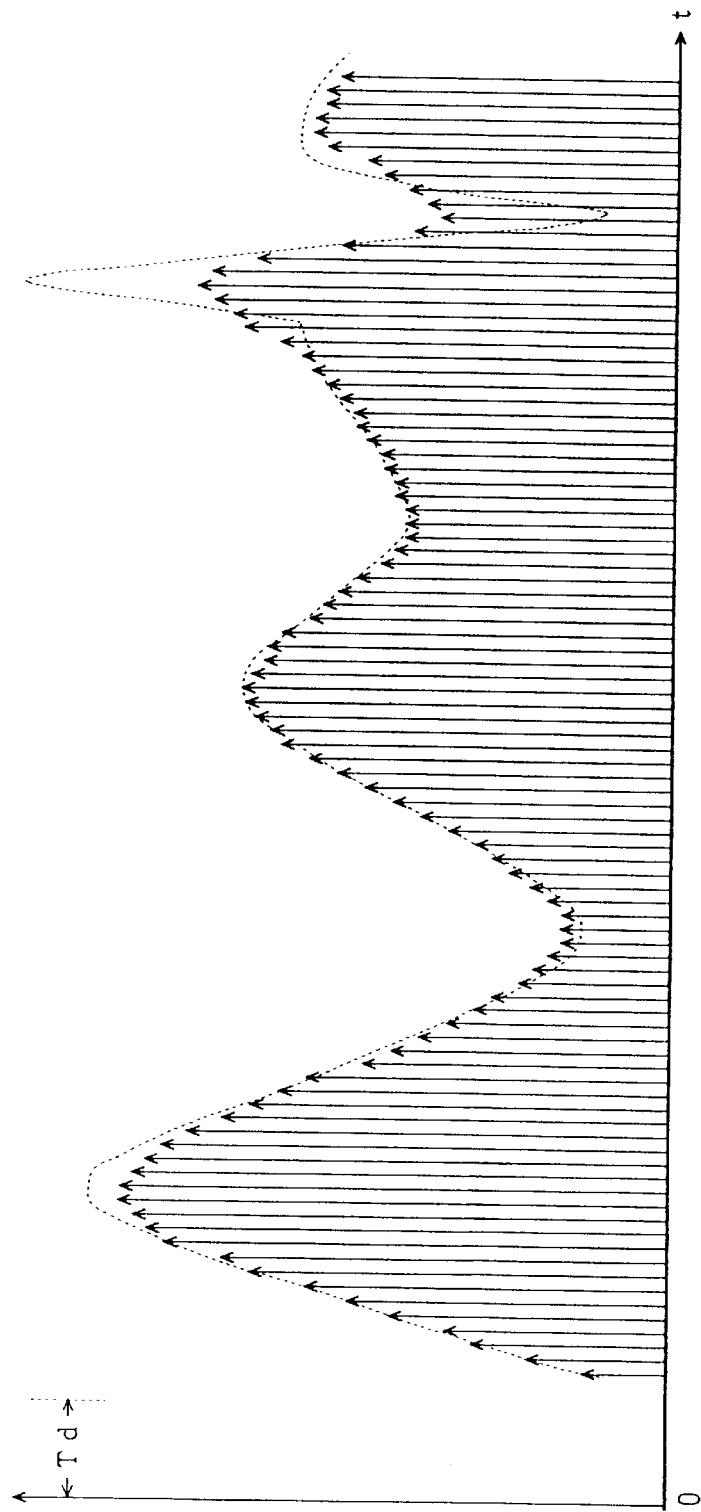
FIG. 4 is a diagram showing an output of a digital low-pass filter having a cut-off frequency of 4 kHz.
Figure 5:
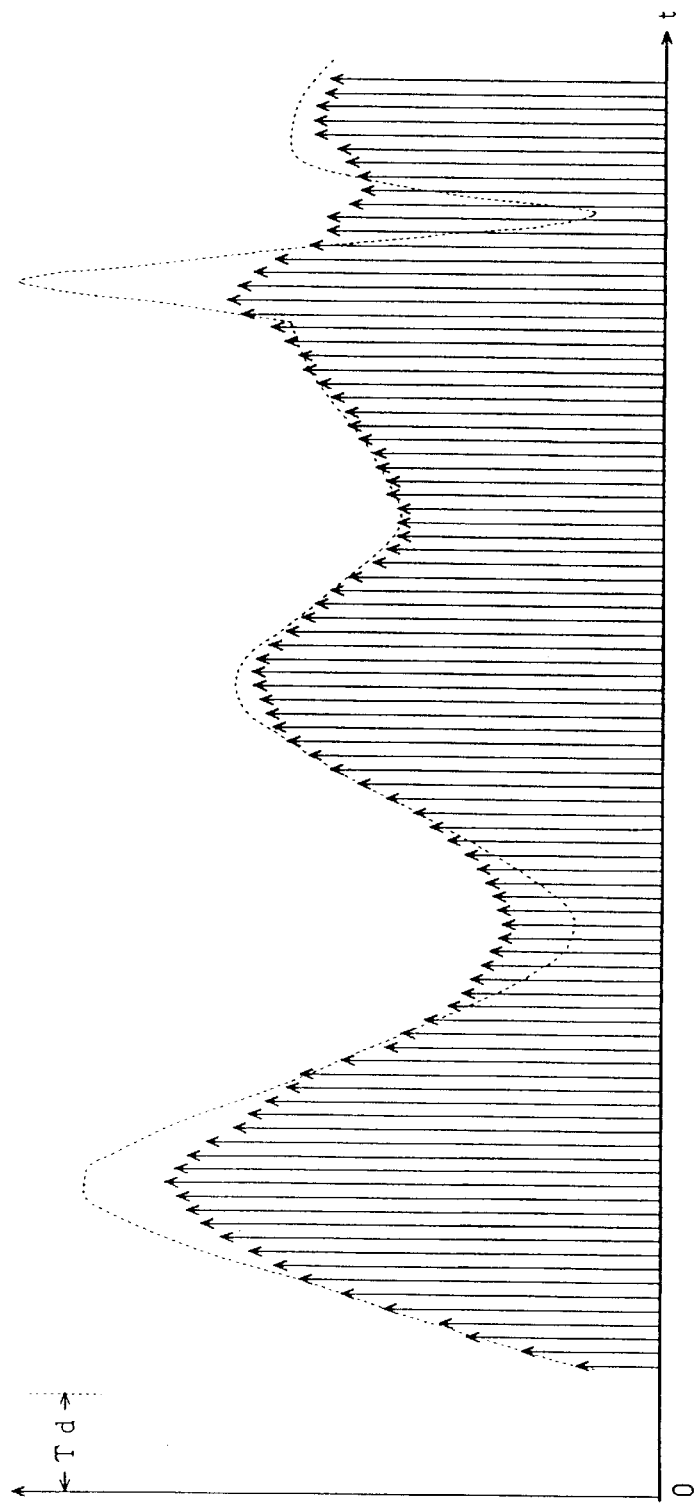
FIG. 5 is a diagram showing an output of a digital low-pass filter having a cut-off frequency of 2.5 kHz.

The counter 2 counts a value r (number of consecutive pre- and post-sampling points excepting a subject sampling point) representative of the degree of quantization distortion at each point of the input digital signal $D_0$, the count value r being output after the delay time Td (refer to FIG. 2). The digital low-pass filters 3 to 5 having different cut-off frequencies perform a predetermined internal calculation to derive the low frequency components of the input digital signal $D_0$ while expanding downward the bit length of the input digital signal by 4 bits, and output signals $D_2$ to $D_4$ of 20-bit length (refer to FIGS. 3 to 5). Each digital low-pass filter 3 to 5 has the group delay time same as Td.

Figure 6:
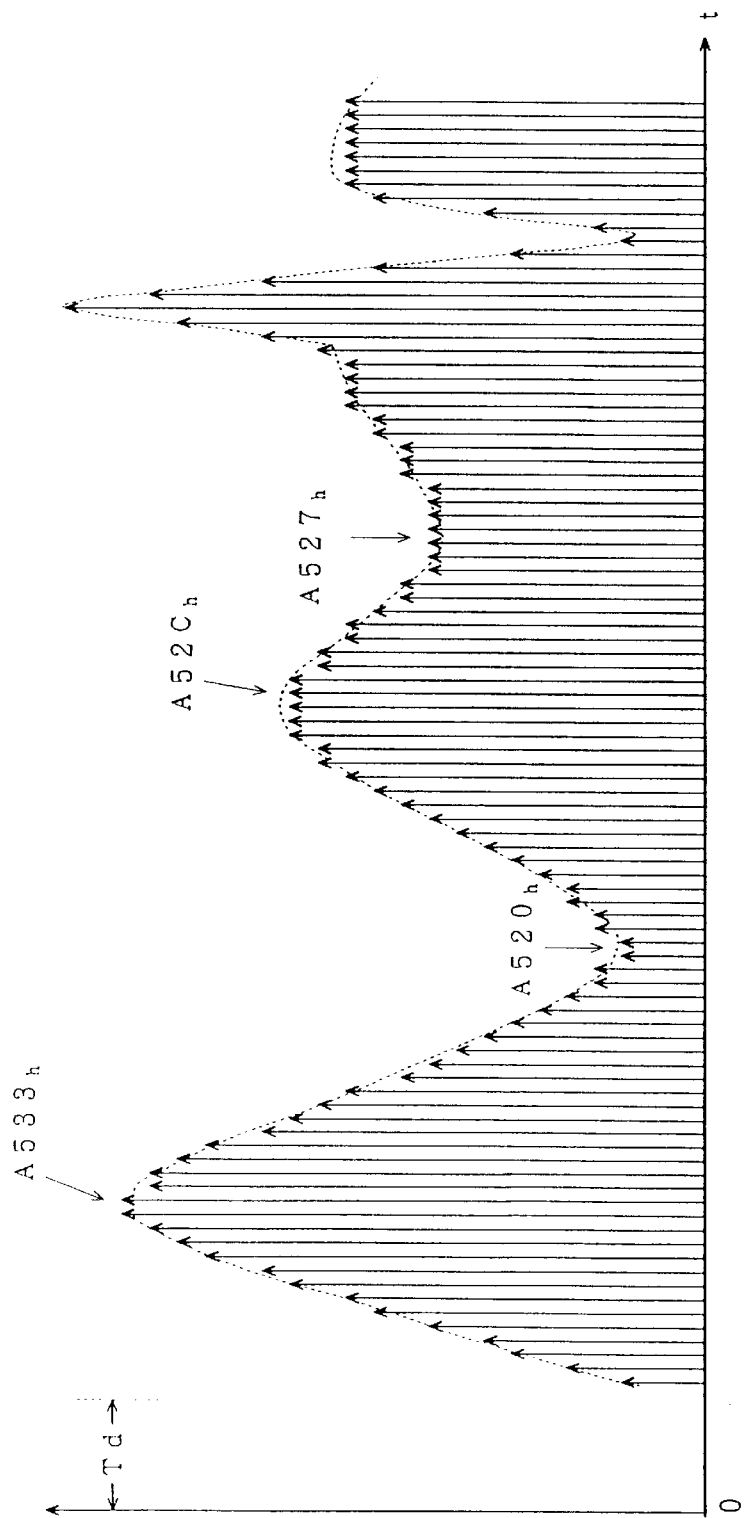
FIG. 6 is a diagram showing an output of a delay unit.
Figure 7:
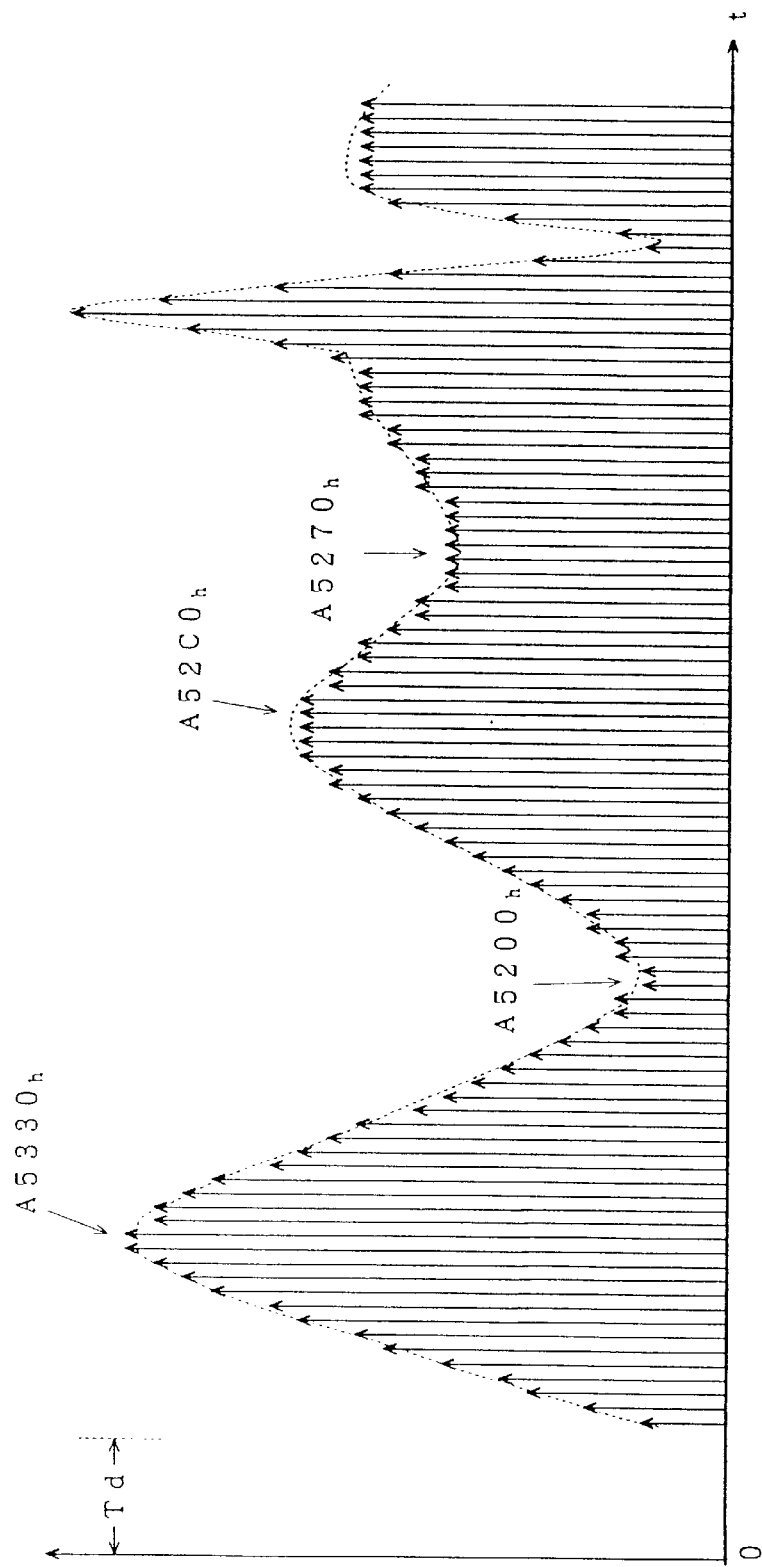
FIG. 7 is a diagram showing an output of a bit expander.

The input digital signal $D_0$ is delayed by Td by the delay unit 8 of the selecting means 6 to compensate for the delay time of the counter 2 and digital low-pass filters 3 to 5 (refer to FIG. 6). The delayed digital input digital signal is expanded by the bit expander 9 downward by 4 bits and output as a signal $D_1$ (refer to FIG. 7). For example, the sample values $A533_h$, $A520_h$, $A52C_h$, and $A527_h$ shown in FIG. 6 are changed to $A5330_h$, $A5200_h$, $A52C0_h$, and $A5270_h$ shown in FIG. 7.

The encoder 7 of the selecting means 6 encodes the count value r and outputs a signal i indicating one of the four stages. In accordance with the signal i, the selector 10 selects and outputs one of $D_1$ to $D_5$ (refer to FIG. 2).

During the period from the first rise slope of the input digital signal $D_0$ shown in FIG. 2 to the second rise slope, the amplitude of the 2 kHz waveform is large, and the same value is not consecutive at almost all points. Therefore, r=0 and the sections $A_0$ to $A_2$ occupy almost the whole period, the sections having a relative quantization distortion smaller than a predetermined value as compared to the signal amplitude. These sections take the signal i="1" so that the selector 10 selects the bit expanded input digital signal $D_1$. It is also the same for sections $A_3$ and $A_4$ ($A_4$ corresponds to the 10 kHz waveform). After the first peak of the input digital signal $D_0$, there are sections $B_0$ to $B_2$ having two to three consecutive points with the same value because of the influence of quantization errors. Although these sections have relative quantization distortion of the predetermined value or larger as compared to the signal amplitude, the distortion is still relatively small so that these sections take r=1 to 2 and i=2 and the selector 10 selects the output $D_2$ of the digital low-pass filter 3. Thereafter, as the 2 kHz waveform gradually attenuates, there appear sections $B_2$ to $B_5$ with two to three consecutive points having the same value and sections $C_0$ and $C_1$ with four to six consecutive points having the same value. These sections have relatively large quantization distortion so that they take r=3 to 5 and i=3 and the selector 10 selects the output $D_3$ of the digital low-pass filter 4. As the 2 kHz waveform greatly attenuates, there appear sections $E_0$ and $E_1$ with seven or more consecutive points having the same value and sections $C_0$ and $C_1$. These sections have considerably large quantization distortion so that they take r≧0 and i=4 and the selector 10 selects the output $D_4$ of the digital low-pass filter 5.

Figure 8:
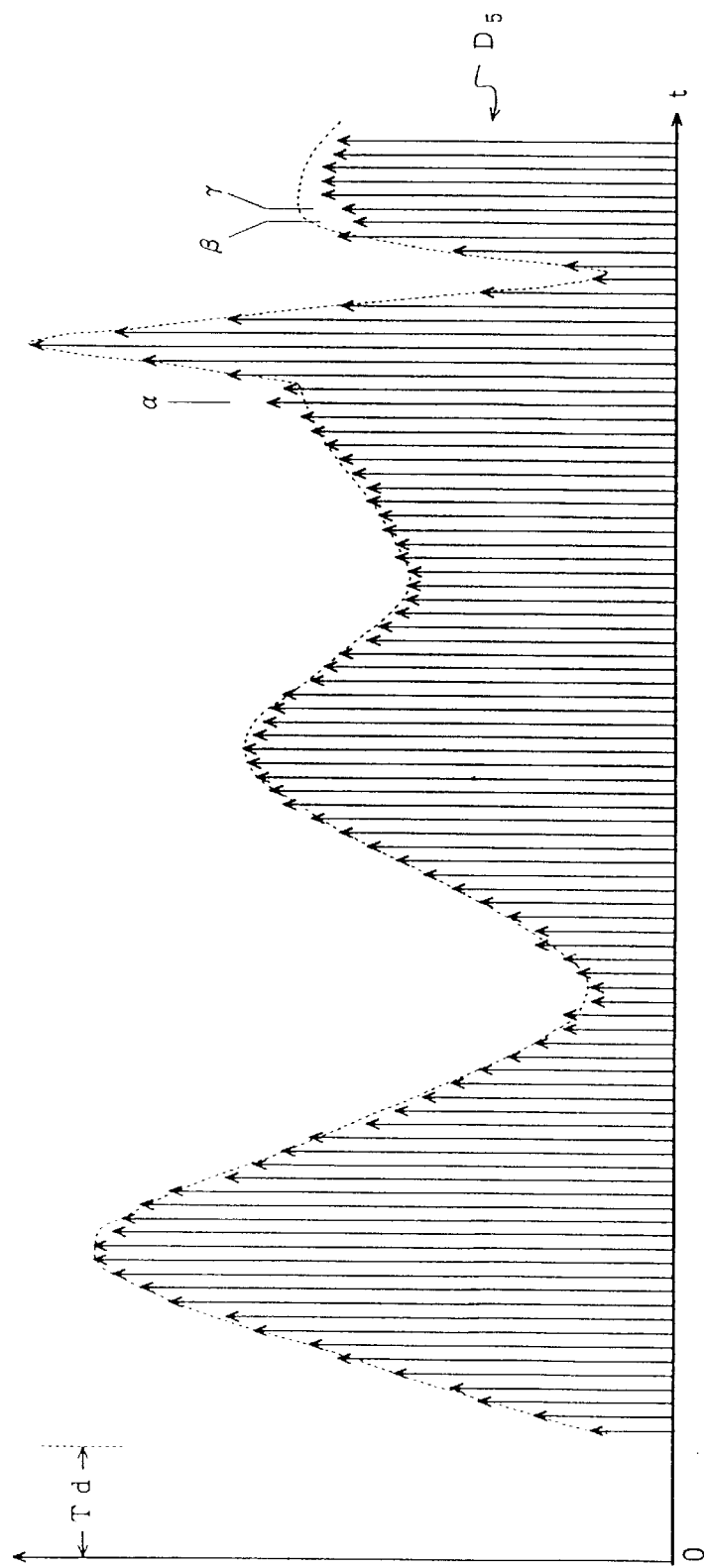
FIG. 8 is a diagram showing an output of a selecting means.

As a result, the output of the selecting means becomes as shown in FIG. 8. The corners of sampled rectangles in the sections with consecutive points having the same value shown in FIG. 20 are made smooth and changed to a curve, without unnecessary attenuation of the input signal. As shown, both large and small quantization distortions as compared to the signal amplitude can be reduced.

However, as shown in FIG. 8, there are discontinuous points α, β, and γ near at the switching timings of the selector 10. These discontinuous points can be corrected by the deriving means 11 and correcting means 14.

Specifically, the deriving means 11 derives a discontinuous point if a difference δ between the value of the output $D_5$ of the selecting means 6 at each point and a value of the bit expanded input digital signal $D_1$ at the corresponding point is a predetermined value or larger, and at the same time, it discriminates between the positive and negative differences. While the output $D_5$ of the selecting means 6 is not a discontinuous point, the correcting means 14 outputs $D_5$ itself, whereas if the output $D_5$ is a discontinuous point and the difference δ is positive, this discontinuous point is converted into a value obtained by adding a predetermined value to a value of the bit expanded input digital signal $D_1$ at the subject point, and if the difference δ is negative, this discontinuous point is converted into a value obtained by subtracting a predetermined value from a value of the bit expanded input digital signal $D_1$ at the subject point. In this manner, the discontinuous point is made continuous.

Figure 9:
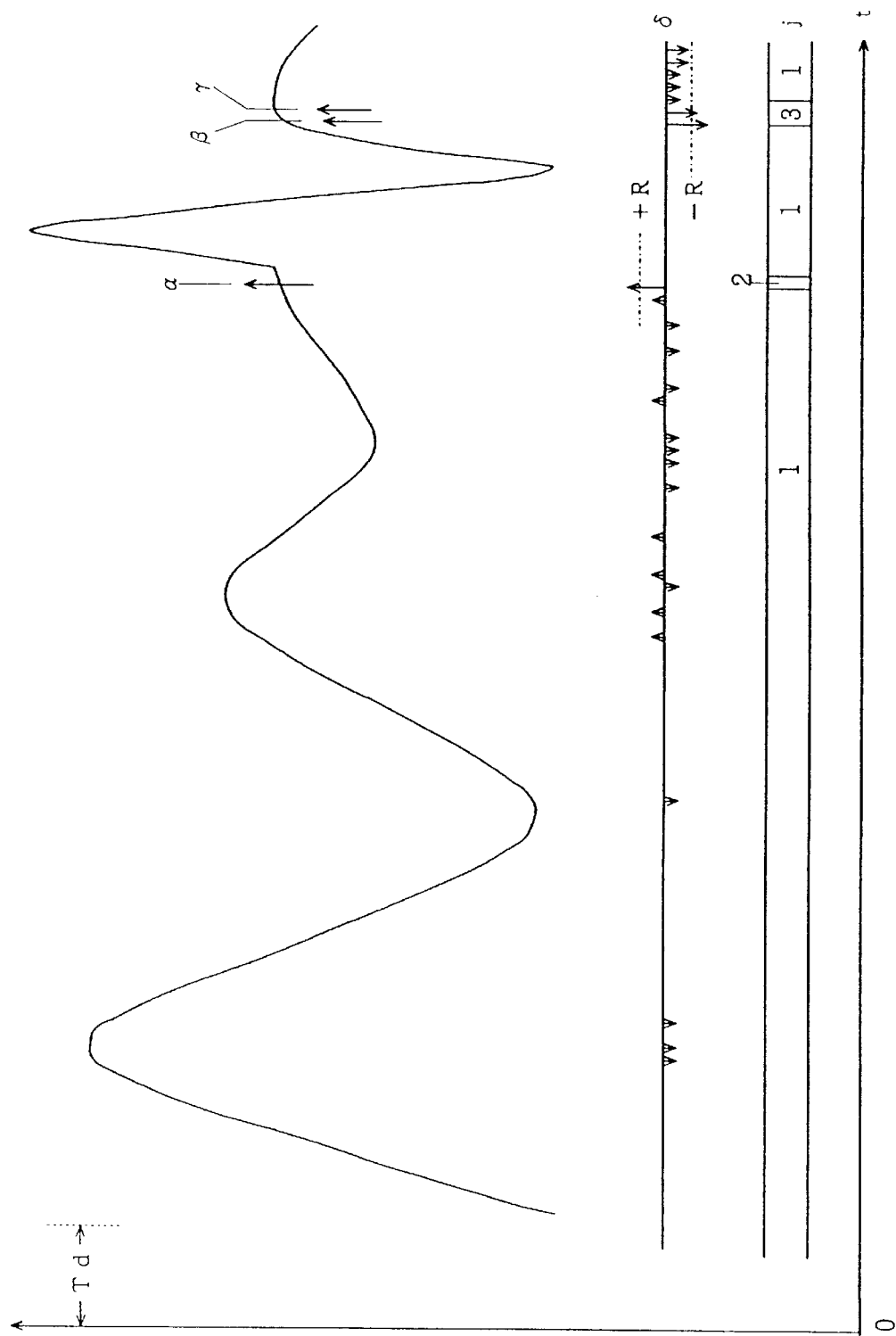
FIG. 9 is a diagram illustrating an operation of a deriving means.
Figure 10:
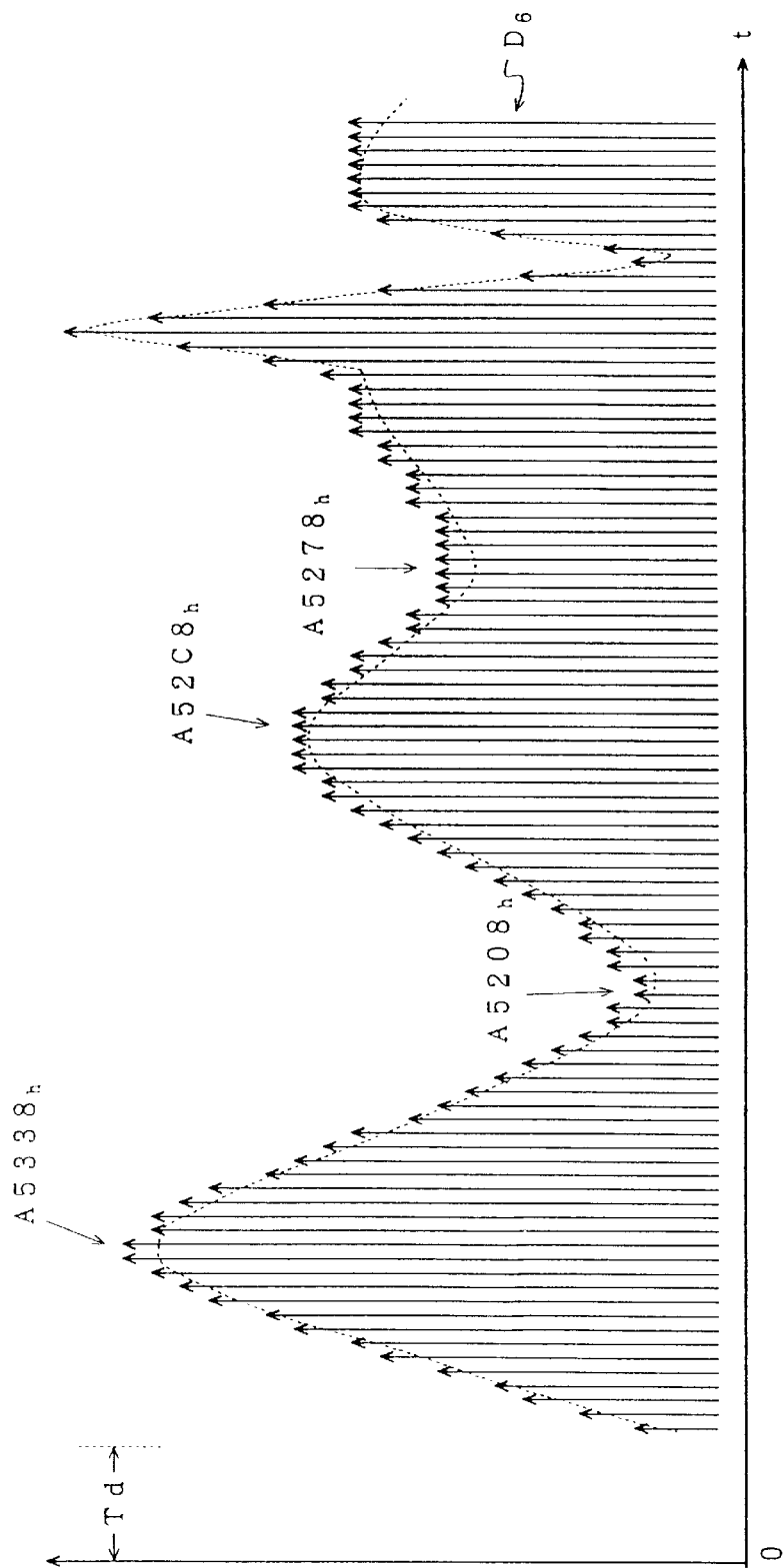
FIG. 10 is a diagram showing an output of an adder.

Specifically, the subtracter 12 calculates the difference δ between the output $D_5$ of the selecting means 6 and the delayed and bit expanded input digital signal $D_1$ (refer to FIG. 9). The comparator 18 compares the difference 8 with the values +R and −R (R=8), and outputs j=1 if −R<δ<+R, j=2 if +R≦δ, or j=3 if δ≦−R (refer to FIG. 9). In FIG. 8, the discontinuous point α takes j=1, and β and γ take j=3, and other points take j=1.

Figure 11:
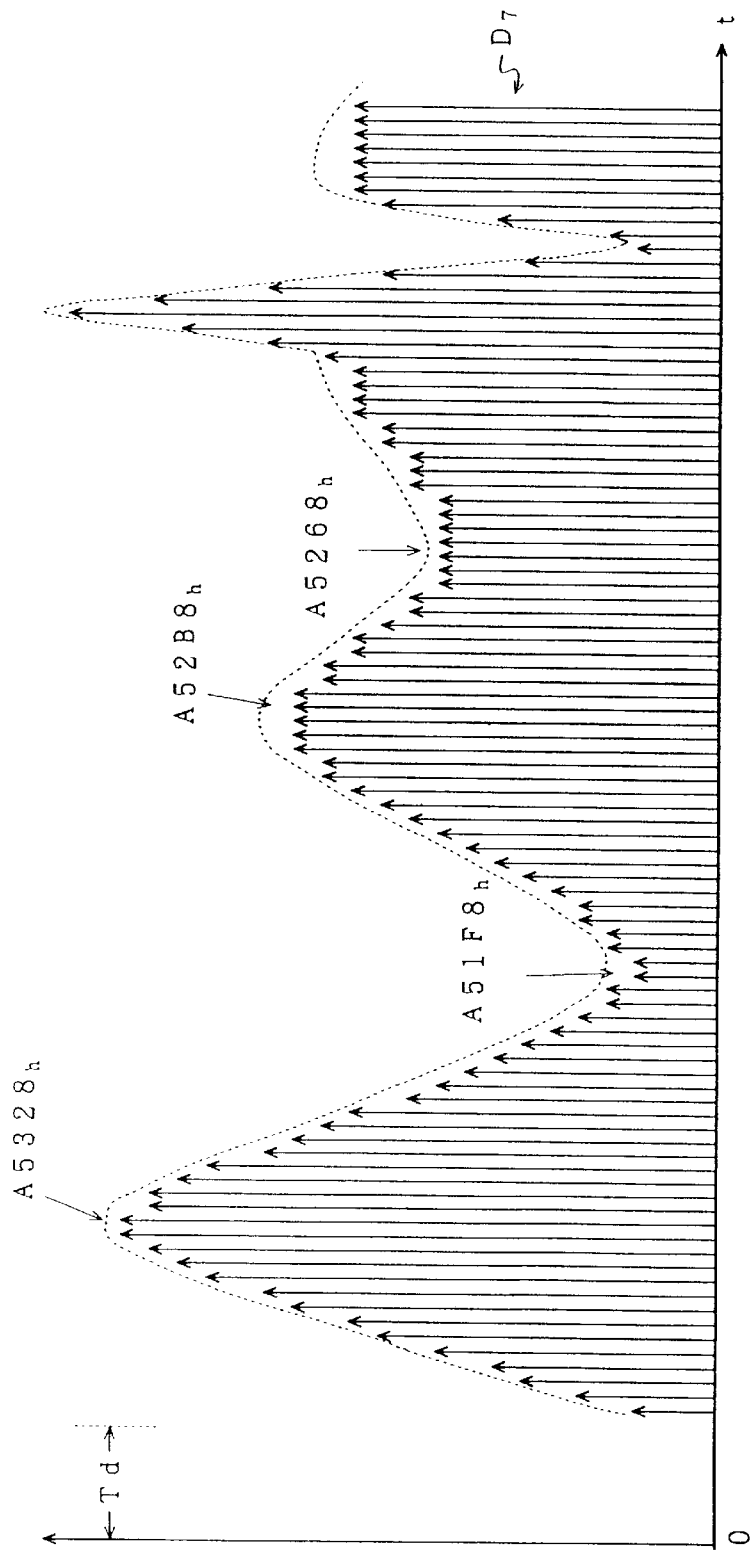
FIG. 11 is a diagram showing an output of a subtracter.

The adder 15 of the correcting means 14 adds R' (=R) to $D_1$ and outputs $D_6$ (refer to FIG. 10), and the subtracter 16 subtracts R' from $D_1$ and outputs $D_7$ (refer to FIG. 11). $D_6$ is an upper limit value the final output can take, and $D_7$ is a lower limit value the final output can take.

Figure 12:
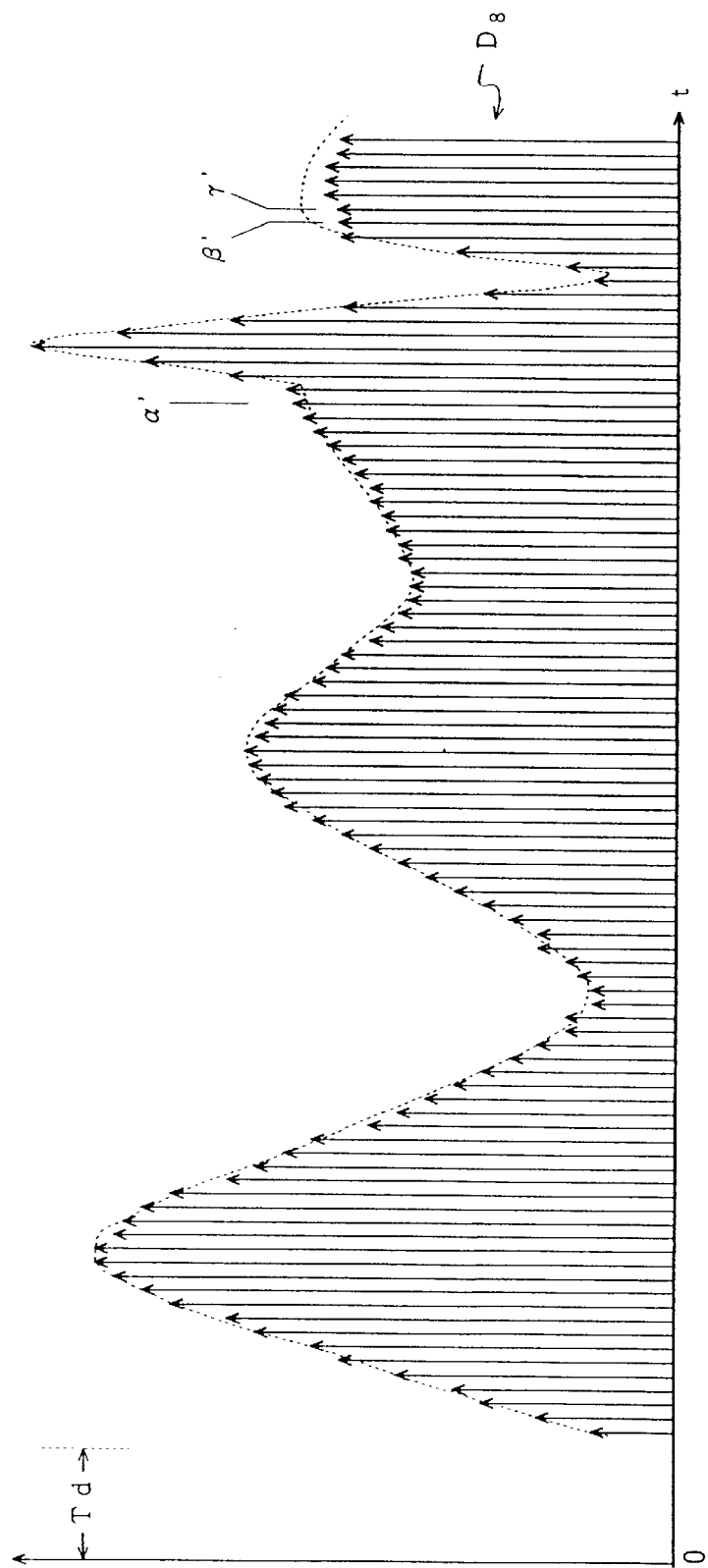
FIG. 12 is a diagram showing an output of a correcting means.

The selector 17 selects and outputs the output $D_5$ of the selecting means 6 while the comparator 13 outputs j=1. At the discontinuous point a of $D_5$, the comparator 13 outputs j=2 and the selector 17 selects and outputs $D_6$ of the adder 15 instead of α. Similarly, at the discontinuous point β (γ) of $D_5$, the comparator 13 outputs j=3 and the selector 17 selects and outputs $D_7$ of the subtracter 16 instead of β (γ). In this manner, the selector 17 outputs a digital signal $D_8$ in which as shown in FIG. 12, the discontinuous amounts at the discontinuous points α, β, and γ are reduced and points α', β', and γ' are output to smooth the output signal waveform.

Figure 13:
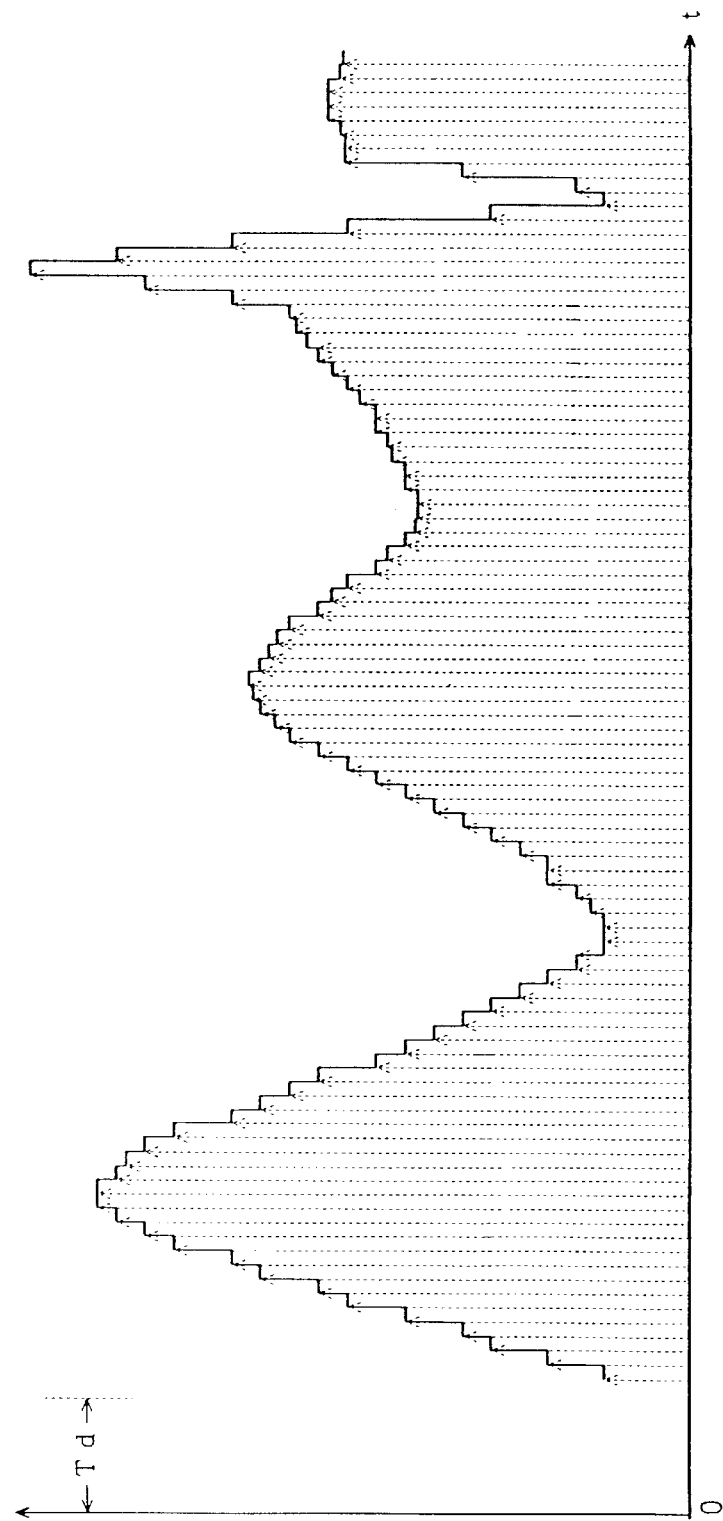
FIG. 13 is a diagram showing a waveform of an output of the correcting means after being passed through a D/A converter.
Figure 14:
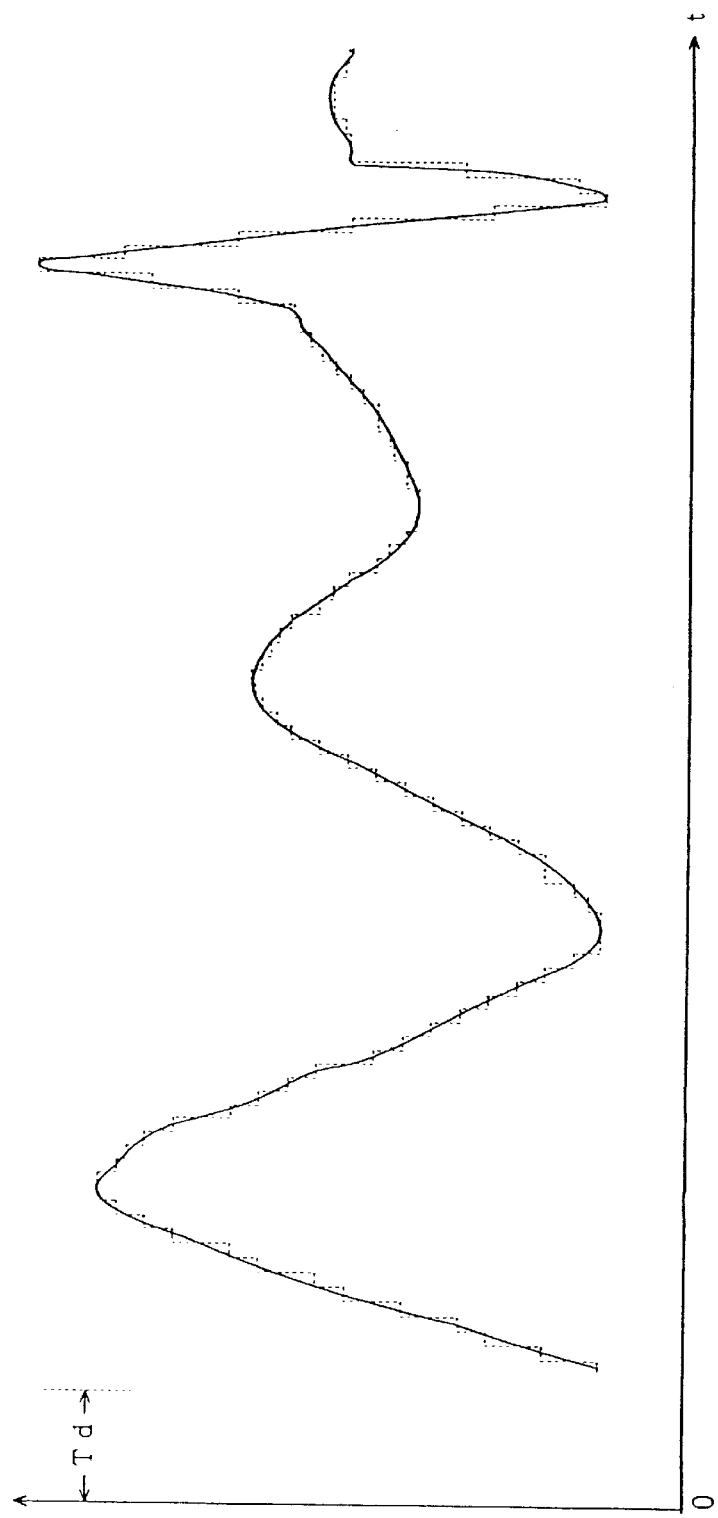
FIG. 14 is a diagram showing a waveform of an output of the correcting means after being passed through the D/A converter and an analog low-pass filter.
Figure 19:
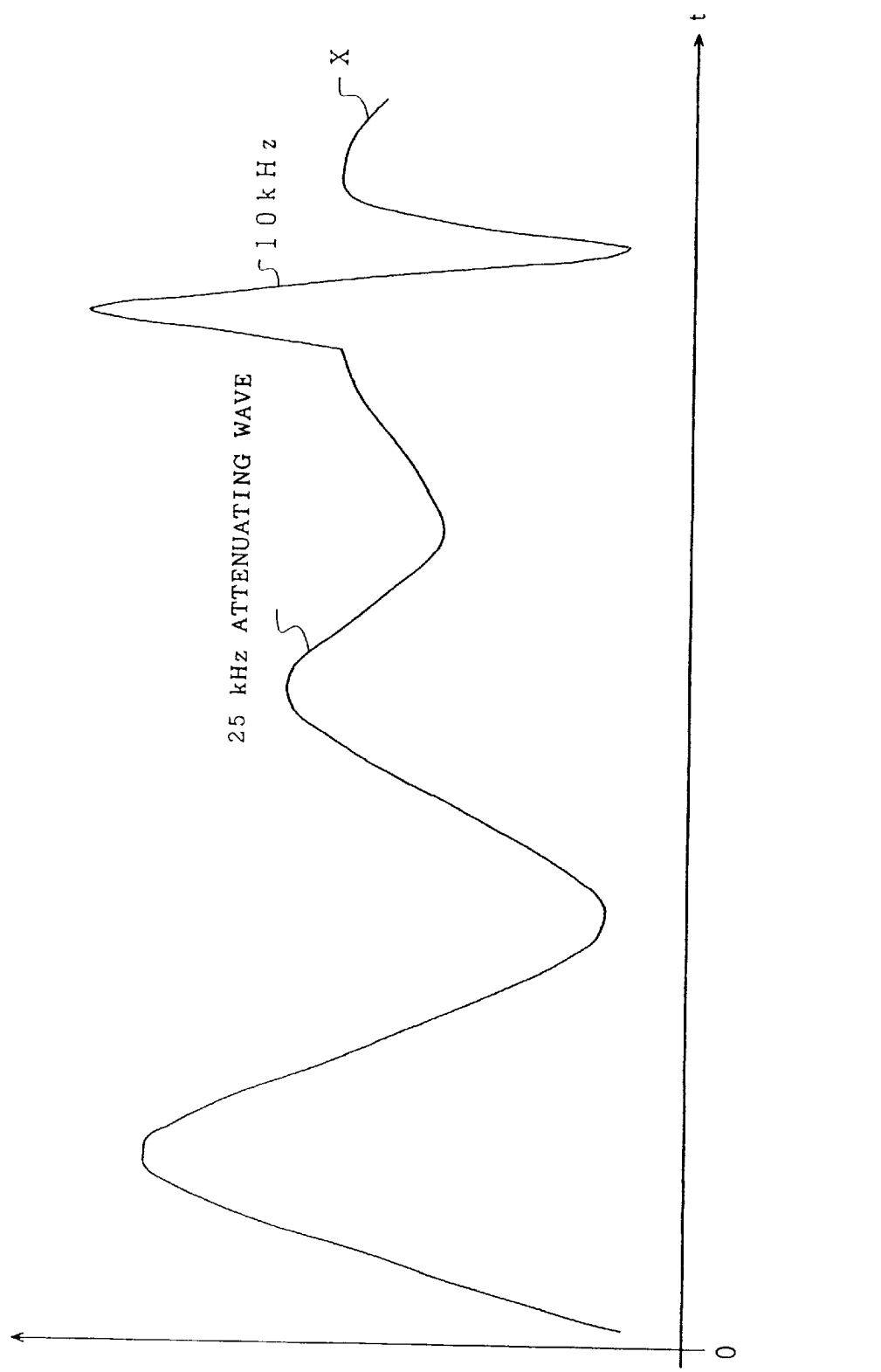
FIG. 19 is a diagram showing an example of an analog signal.
Figure 22:
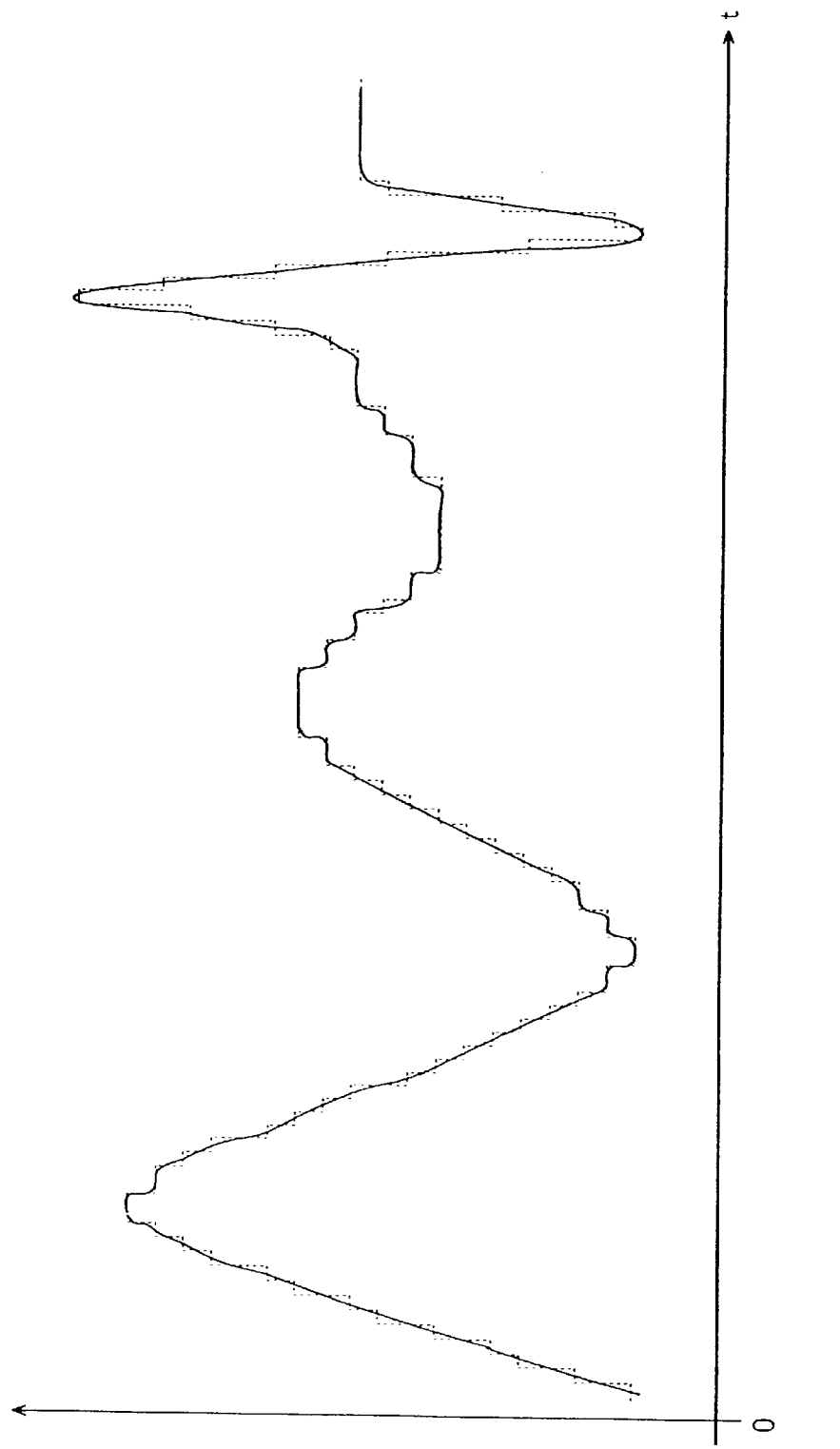
FIG. 22 is a diagram showing a waveform of the signal shown in FIG. 21 after being passed through an analog low-pass filter having a cut-off frequency of 20 kHz.
Figure 23:
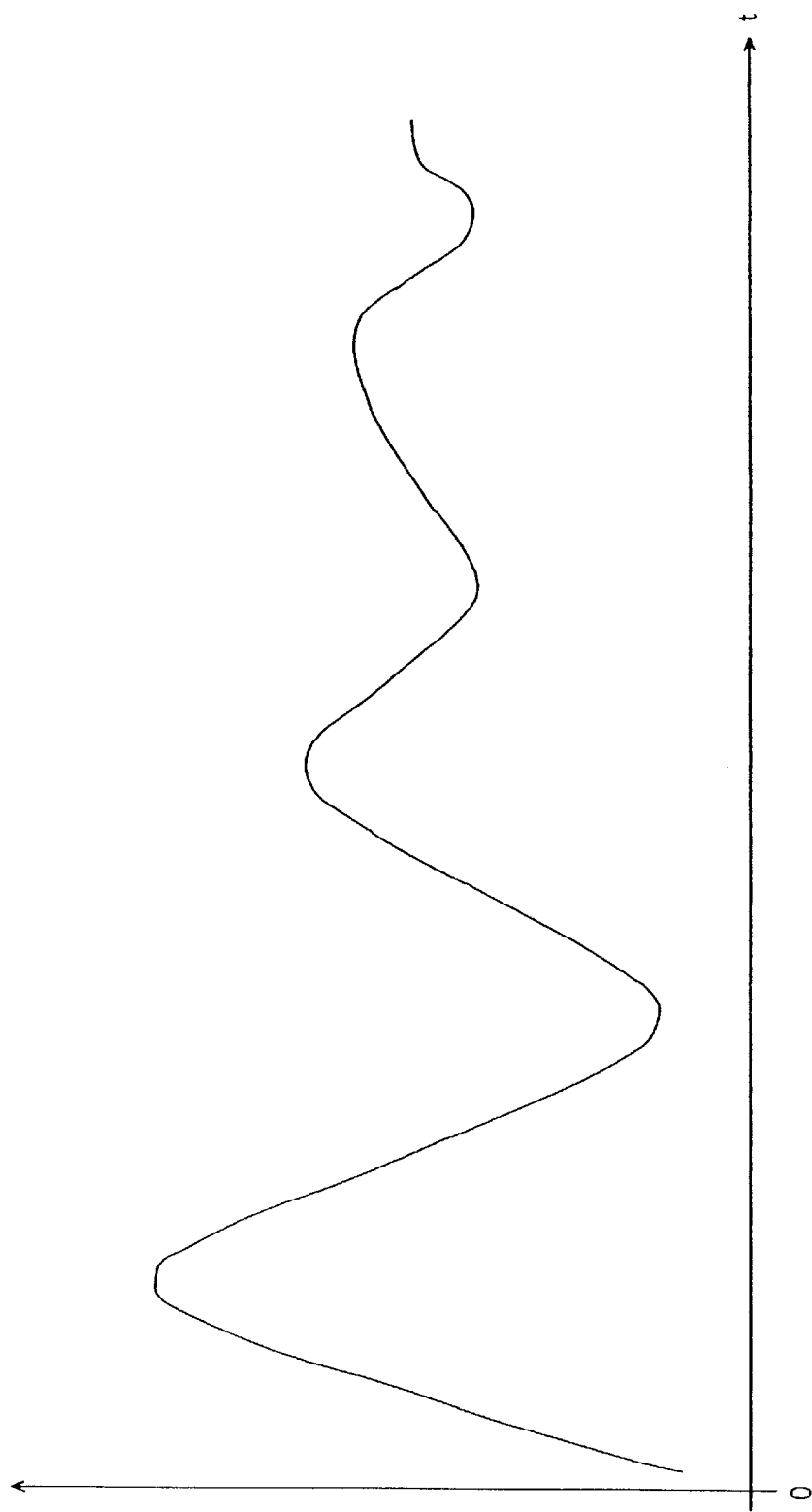
FIG. 23 is a diagram showing a waveform of the signal shown in FIG. 21 after being passed through an analog low-pass filter having a cut-off frequency of 3 kHz.

If the digital signal $D_8$ is D/A converted by a D/A converter (not shown) of 20 bits, the converted signal becomes as shown in FIG. 13, and if this converted signal is passed through an analog low-pass filter (not shown) having a cut-off frequency of 20 kHz, the signal becomes as shown in FIG. 14. From the comparison of the signal shown in FIG. 14 with the conventional example shown in FIG. 22, it can be understood that quantization distortion can be considerably reduced both in small amplitude signal regions and in large amplitude signal regions.

In the above embodiment, three low-pass filters having different cut-off frequencies are used. Instead, two, four, or more low-pass filters may be used. Quantization distortion can also be reduced by providing a single digital low-pass filter having predetermined cut-off frequencies such as 7 kHz, 4 kHz, and 2.5 kHz. In this case, if the count value r counted by the counter 2 is n or smaller (n is 0, or an integer 1 or large such as 2, 3, 4, and 5), the selector 10 selects the delayed and bit expanded input digital signal $D_1$, whereas if the count value r is larger than n, the selector 10 selects the output of the digital low-pass filter.

Deriving a discontinuous point from the output of the selector 10 and correcting the signal value for making it continuous my be carried out by other methods different from the above embodiment. For example, as shown in FIG. 15, an adder 15A of a correcting means 14A adds a positive constant value R' to the output $D_5$ of the selector 10 and a subtracter 16A subtracts the positive constant value R' from $D_5$. The deriving means 11 calculates the difference δ between $D_5$ and the output $D_1$ of the bit expander 9, and the comparator 13 compares the difference with +R and −R. If −R<δ<+R and $D_5$ does not contain a discontinuous point (j=1), then a selector 17A selects and outputs $D_5$. If δ≦−R and $D_5$ contains a negative discontinuous point (j=3), then the selector 17A selects and outputs the output of the adder 15A, $D_5$. Conversely, if +R≦δ and $D_5$ contains a positive discontinuous point (j=2), then the selector 17A selects and outputs the output of the subtracter 16A. R' may take the same value as R or a different value.

Even with the example shown in FIG. 15, discontinuous points having a value larger than a predetermined value and contained in the output $D_5$ of the selector 10 can be reliably removed with a relatively simple circuit arrangement.

In another method of avoiding a discontinuous point in an output signal, as shown in FIG. 16, in a correcting means 14B, $D_5$ is delayed by two delay units 19 and 20 each having a delay time of one sampling period to generate $D_{51}$ and $D_{52}$, and an averaging unit 21 calculates an average of three values $D_5$, $D_{51}$, and $D_{52}$. In a deriving means 11B, $D_5$ is delayed a delay unit 22 having a delay time of one sampling period to generate $D_{11}$, a subtracter 12 calculates the difference between $D_{51}$ and $D_{11}$, a comparator 13B compares the difference with +R and −R, and outputs j'=1 indicating that there is no discontinuous point if −R<δ<+R, or j'=2 indicating that a discontinuous point has been derived if δ≦−R or +R≦δ. A selector 17B of the correcting means 14B selects and outputs $D_{51}$ if $D_{51}$ does not contain a discontinuous point and j'=1 or an output of the averaging unit 21 if $D_{51}$ contains a discontinuous point and j'=2.

In the example shown in FIG. 16, a point having a difference of a predetermined value or larger between the value of the output $D_5$ of the selector 10 and the value of the bit expanded input digital signal $D_1$ at the corresponding point is derived as the discontinuous point. Therefore, discontinuous points having a value larger than a predetermined value and contained in the output $D_5$ of the selector 10 can be reliably removed with a relatively simple circuit arrangement. Furthermore, if a discontinuous point having a predetermined value or larger is contained in the output $D_5$ of the selector 10, $D_5$ is replaced by an average of a plurality of points near the discontinuous point. Therefore, the discontinuous point can be changed easily to a smooth curve by using a simple circuit arrangement.

In the example shown in FIG. 16, the averaging unit 21 may calculate an average of two points of $D_5$ and $D_{51}$ or two points of $D_5$ and $D_{52}$, or calculate an average of two points $D_{51}$ and $D_{52}$ without using the value at the discontinuous point.

In a further method of avoiding a discontinuous point in an output signal, as shown in FIG. 17, in a correcting means 14C, $D_5$ and $D_1$ are averaged by an averaging unit 23. In a deriving means 11C, the subtracter 12 calculates the difference between $D_5$ and $D_1$, a comparator 13C compares the difference with +R and −R, and outputs j'=1 indicating that there is no discontinuous point if −R<δ<+R, or j'=2 indicating that a discontinuous point has been derived if δ≦−R or +R≦δ. A selector 17C of the correcting means 14C selects and outputs $D_5$ if $D_5$ does not contain a discontinuous point and j'=1 or an output of the averaging unit 23 if $D_5$ contains a discontinuous point and j'=2.

In the example shown in FIG. 17, a discontinuous point contained in the output $D_5$ of the selector 10 is replaces by an average of the value at the discontinuous point and the value of the bit expanded input digital signal $D_1$ at the corresponding point to make the output signal continuous.

Therefore, discontinuous points can be easily changed to smooth curves with a relatively simple circuit arrangement. Furthermore, if a discontinuous point having a predetermined value or larger is contained in the output $D_5$ of the selector 10, $D_5$ is replaced by an average of a plurality of points near the discontinuous point. Therefore, the discontinuous point can be changed easily to a smooth curve by using a simple circuit arrangement.

In a still further method of avoiding a discontinuous point in an output signal, as shown in FIG. 18, in a correcting means 14D, the output of a selector 17D is delayed by a delay unit 24 having a delay time of one sampling period, and the selector 17D selects and outputs either the output $D_5$ of the selector or the output of the delay unit 24. In a deriving means 11D, the subtracter 12 calculates the difference between $D_5$ and $D_1$, a comparator 13D compares the difference with +R and −R, and outputs j'=1 indicating that there is no discontinuous point if −R<δ<+R, or j'=2 indicating that a discontinuous point has been derived if δ≦−R or +R≦δ. The selector 17D of the correcting means 14D selects and outputs $D_5$ if $D_5$ does not contain a discontinuous point and j'=1 or an output of the delay unit 24 if $D_5$ contains a discontinuous point and j'=2.

In the example shown in FIG. 18, a discontinuous point in $D_5$ is replaced by the value of a continuous point immediately before the discontinuous point.

Therefore, discontinuous points can be easily changed to smooth curves by using a relatively simple circuit arrangement.

According to the quantization distortion reducing apparatus of the invention, the low frequency components of the input digital signal having a frequency of a predetermined cut-off frequency or lower are picked up by a digital filter while expanding downward the bit length of the input digital signal. The counter means counts the number of pre- and post-sampling points having the same value at each point of the input digital signal. In accordance with the count value of the counting means, the selecting means selects and outputs the input digital signal whose bit length was expanded downward, for the sections having the count value of the predetermined value or smaller, or a signal passed through the digital filter, for the sections having the count value of the predetermined value or larger. Therefore, for the sections having a predetermined number of consecutive points or more with the same value and having relatively large quantization distortion as compared to the signal amplitude, the input digital signal is replaced by a signal containing the low frequency components of the input digital signal having a frequency of the predetermined cut-off frequency or lower and picked up by the digital filter while expanding downward the bit length of the input digital signal. Therefore, the output signal can be changed to a smooth curve and quantization distortion can be reduced. For the sections not having a predetermined number of consecutive points or more with the same value and having relatively small quantization distortion as compared to the signal amplitude, the input digital signal whose bit length was expanded downward is used at it is. Therefore, the high frequency components are not attenuated unnecessarily.

Further, a plurality of digital filters are provided each filter having a different cut-off frequency. The selecting means selects and outputs the input digital signal whose bit length was expanded downward, for the sections having the count value of a predetermined value or smaller counted by the counting means, or a signal passed through one of the digital filters having a lower cut-off frequency in correspondence with an increase in the count value. Therefore, both large and small quantization distortions as compared to the signal amplitude can be reliably reduced while avoiding an attenuation of the signal components.

Still further, the deriving means derives a discontinuous point contained in the output of the selecting means, and the correcting means makes the discontinuous point continuous. Therefore, it is possible to prevent a new generation of waveform distortion.

Further, the deriving means derives as the discontinuous point a point having a difference of a predetermined value or larger between the value of the output of the selecting means at each point and the value of the input digital signal at the corresponding point. Therefore, a discontinuous point of the output of the selecting means can be easily and correctly judged.

Furthermore, the deriving means derives as the discontinuous point a point having a difference of a predetermined value or larger between the value of the output of the selecting means at each point and the value of the input digital signal at the corresponding point, and discriminates between the positive and negative difference values. The correcting means replaces the discontinuous point in the output of the selecting means derived by the deriving means by a value obtained through addition or substraction of a value preset in accordance with the positive or negative difference, to or from the input digital signal, for smoothing the output signal. Therefore, it becomes possible to reliably avoid a generation of a discontinuous point in the output signal having a predetermined value or larger, by using a simple circuit arrangement.

Still, the deriving means derives as the discontinuous point a point having a difference of a predetermined value or larger between the value of the output of the selecting means at each point and the value of the input digital signal at the corresponding point, and discriminates between the positive and negative difference values. The correcting means replaces the discontinuous point in the output of the selecting means derived by the deriving means by a value obtained through addition or substraction of a value preset in accordance with the positive or negative difference, to or from the value of the discontinuous point, for smoothing the output signal. Therefore, it becomes possible to reliably avoid a generation of a discontinuous point in the output signal having a predetermined value or larger, by using a simple circuit arrangement.

Still, the correcting means replaces the discontinuous point in the output of the selecting means derived by the deriving means by an average of the values of a plurality of points near the discontinuous point, for smoothing the output signal. Therefore, it becomes possible to reliably avoid a generation of a discontinuous point in the output signal, by using a simple circuit arrangement.

Still further, the correcting means replaces the discontinuous point in the output of the selecting means derived the deriving means by an average of the value of the discontinuous point and the value of the input digital signal at the corresponding point. Therefore, it becomes possible to reliably avoid a generation of a discontinuous point in the output signal, by using a simple circuit arrangement.

Still, the correcting means replaces the discontinuous point in the output of the selecting means derived by the deriving mans by a value at a continuous point immediately before the discontinuous point. Therefore, it becomes possible to reliably avoid a generation of a discontinuous point in the output signal, by using a simple circuit arrangement.

What is claimed is:

1. An apparatus for reducing quantization distortion, comprising:

a digital filter for picking up the low frequency components of an input digital signal having a frequency of a predetermined cut-off frequency or lower while expanding downward the bit length of the input digital signal so as to obtain an output digital signal having the expanded bit length;

counter means for counting the number of consecutive samples having a same quantized level before and after each sample point of the input digital signal;

selecting means for selecting and outputting, in accordance with the count value of said counting means, the input digital signal whose bit length was expanded downward, for the sections having the count value of a predetermined value or smaller, or a signal passed through said digital filter, for the sections having the count value of a predetermined value or larger;

deriving means for deriving a discontinuous point contained in the output of said selecting means; and correcting means for making the discontinuous point continuous.

2. An apparatus according to claim 1, wherein:

said digital filter includes a plurality of digital filters each having a different cut-off frequency; and said selecting means selects and outputs either the input digital signal whose bit length was expanded downward, for the sections having the count value of a predetermined value or smaller counted by said counting means, or a signal passed through one of said digital filters having a lower cut-off frequency in correspondence with an increase in the count value, for the sections having the count value of a predetermined value or larger.

3. An apparatus according to claim 1 or 2, wherein, wherein said deriving means derives as the discontinuous point a point having a difference of a predetermined value or larger between the value of the output of said selecting means at each point and the value of the input digital signal at the corresponding point.

4. An apparatus according to claim 1 or 2, wherein:

said deriving means derives as the discontinuous point a point having a difference of a predetermined value or larger between the value of the output of said selecting means at each point and the value of the input digital signal at the corresponding point, and discriminates between the positive and negative difference values; and said correcting means replaces the discontinuous point in the output of said selecting means derived by said deriving means by a value obtained through addition or subtraction of a value preset in accordance with the positive or negative difference, to or from the input digital signal, for smoothing the output signal.

5. An apparatus according to claim 1 or 2, wherein:

said deriving means derives as the discontinuous point a point having a difference of a predetermined value or larger between the value of the output of said selecting means at each point and the value of the input digital signal at the corresponding point, and discriminates between the positive and negative difference values; and said correcting means replaces the discontinuous point in the output of said selecting means derived by said deriving means by a value obtained through addition or subtraction of a value preset in accordance with the positive or negative difference, to or from the value or the discontinuous point, for smoothing the output signal.

6. An apparatus according to claim 1 or 2, wherein said correcting means replaces the discontinuous point in the output of said selecting means derived by said deriving means by an average of the values of a plurality of points near the discontinuous point, for smoothing the output signal.

7. An apparatus according to claim 1 or 2, wherein said correcting means replaces the discontinuous point in the output of said selecting means derived by said deriving means by an average of the value of the discontinuous point and the value of the input digital signal at the corresponding point.

8. An apparatus according to claim 1 or 2, wherein said correcting means replaces the discontinuous point in the output of said selecting means derived by said deriving means by a value at a continuous point immediately before the discontinuous point.

9. An apparatus according to claim 3, wherein:

said correcting means replaces the discontinuous point in the output of said selecting means derived by said deriving means by an average of the values of a plurality of points near the discontinuous point, for smoothing the output signal.

10. An apparatus according to claim 3, wherein:

said correcting means replaces the discontinuous point in the output of said selecting means derived by said deriving means by an average of the value of the discontinuous point and the value of the input digital signal at the corresponding point.

11. An apparatus according to claim 3, wherein:

said correcting means replaces the discontinuous point in the output of said selecting means derived by said deriving means by a value at a continuous point immediately before the discontinuous point.

12. An apparatus for reducing quantization distortion, comprising:

a digital filter for picking up the low frequency components of an input digital signal having a frequency of a predetermined cut-off frequency or lower while expanding downward the bit length of the input digital signal so as to obtain an output digital signal having the expanded bit length;

counter means for counting the number of consecutive samples having a same quantized level before and after each sample point of the input digital signal;

selecting means for selecting and outputting, in accordance with the count value of said counting means, the input digital signal whose bit length was expanded downward, for the sections having the count value of a predetermined value or smaller, or a signal passed through said digital filter, for the sections having the count value of a predetermined value or larger; and correcting means for detecting a discontinuous point contained in the output of said selecting means and making the detected discontinuous point continuous.

13. An apparatus according to claim 12, wherein:

said digital filter includes a plurality of filters each having a different cut-off frequency; and said selecting means selects and outputs either the input digital signal whose bit length was expanded downward, for the sections having the count value of a predetermined value or smaller counted by said counting means, or a signal passed through one of said digital filters having a lower cut-off frequency in correspondence with an increase in the count value, for the sections having the count value of a predetermined value or larger.

14. An apparatus according to claim 12 or 13, wherein:
said correcting means replaces the value of the discontinuous point in the output of said selecting means with a value obtained by adding or subtracting a preset value to or from the value of the input digital signal at the corresponding point in accordance with the positive or negative difference between the value of the discontinuous point and the value of the input digital signal at the corresponding point, to smooth the output signal.

15. An apparatus according to claim 12 or 13, wherein:
said correcting means replaces the value of the discontinuous point in the output of said selecting means with a value obtained by subtracting or adding a preset value from or to the value of the discontinuous point in accordance with the positive or negative difference between the value of the discontinuous point and the value of the input digital signal at the corresponding point, to smooth the output signal.

16. An apparatus according to claim 12 or 13; wherein:
said correcting means replaces the value of the discontinuous point in the output of said selecting means an average of the values of a plurality of points near the discontinuous point to smooth the output signal.

17. An apparatus according to claim 12 or 13, wherein:
said correcting means replaces the value of the discontinuous point in the output of said selecting means with an average of the value of the discontinuous point and the value of the input digital signal at the corresponding point.

18. An apparatus according to claim 12 or 13, wherein:
said correcting means replaces the value of the discontinuous point in the output of said selecting means with a value of a continuous point immediately before the discontinuous point.

* * * * *